United States Patent
Guo et al.

(10) Patent No.: US 11,894,072 B2
(45) Date of Patent: Feb. 6, 2024

(54) TWO-SIDE STAIRCASE PRE-CHARGE IN SUB-BLOCK MODE OF THREE-TIER NON-VOLATILE MEMORY ARCHITECTURE

(71) Applicant: SanDisk Technologies LLC, Addison, TX (US)

(72) Inventors: Jiacen Guo, Cupertino, CA (US); Xiang Yang, Santa Clara, CA (US); Abhijith Prakash, Milpitas, CA (US)

(73) Assignee: SANDISK TECHNOLOGIES LLC, Addison, TX (US)

( * ) Notice: Subject to any disclaimer, the term of this patent is extended or adjusted under 35 U.S.C. 154(b) by 147 days.

(21) Appl. No.: 17/724,769

(22) Filed: Apr. 20, 2022

(65) Prior Publication Data
US 2023/0343400 A1 Oct. 26, 2023

(51) Int. Cl.
| | |
|---|---|
| G11C 16/08 | (2006.01) |
| G11C 16/34 | (2006.01) |
| G11C 11/56 | (2006.01) |
| G11C 16/10 | (2006.01) |
| G11C 16/04 | (2006.01) |

(52) U.S. Cl.
CPC ...... *G11C 16/3427* (2013.01); *G11C 11/5671* (2013.01); *G11C 16/0483* (2013.01); *G11C 16/08* (2013.01); *G11C 16/10* (2013.01); *G11C 16/3459* (2013.01)

(58) Field of Classification Search
CPC ............ G11C 16/3427; G11C 11/5671; G11C 16/0483; G11C 16/08; G11C 16/10; G11C 16/3459
See application file for complete search history.

(56) References Cited

U.S. PATENT DOCUMENTS

| | | | | |
|---|---|---|---|---|
| 2,055,549 A | * | 9/1936 | Modine ............... | F28D 1/05383 |
| | | | | 165/146 |
| 4,553,225 A | * | 11/1985 | Ohe ...................... | G11C 29/50 |
| | | | | 365/201 |
| 6,128,229 A | * | 10/2000 | Nobukata .......... | G11C 16/0483 |
| | | | | 365/185.25 |
| 7,269,068 B2 | * | 9/2007 | Chae ..................... | G11C 16/10 |
| | | | | 365/185.17 |
| 9,870,825 B2 | | 1/2018 | Nam et al. | |
| 10,068,657 B1 | | 9/2018 | Yu et al. | |
| 10,354,737 B2 | | 7/2019 | Hu | |

(Continued)

*Primary Examiner* — Khamdan N. Alrobaie
(74) *Attorney, Agent, or Firm* — Dickinson Wright PLLC

(57) ABSTRACT

A memory apparatus and method of operation are provided. The apparatus includes memory cells connected to word lines and disposed in strings. A control means is coupled to the word lines and the strings and is configured to ramp a voltage applied to a selected one of the word lines from a verify voltage to a reduced voltage during a program-verify portion of a program operation. The control means successively ramps voltages applied to each of a plurality of neighboring ones of the word lines from a read pass voltage to the reduced voltage beginning with ones of the plurality of neighboring ones of the word lines immediately adjacent the selected one of the word lines and progressing to ones of the plurality of neighboring others of the word lines disposed increasingly remotely from the selected one of the word lines during the program-verify portion of the program operation.

20 Claims, 21 Drawing Sheets

(56) References Cited

U.S. PATENT DOCUMENTS

| | | | |
|---|---|---|---|
| 10,559,368 B1 | 2/2020 | Yang | |
| 10,957,394 B1 | 3/2021 | Chen et al. | |
| 11,081,162 B1 | 8/2021 | Puthenthermadam et al. | |
| 11,081,179 B2 | 8/2021 | Yang | |
| 11,276,467 B2 * | 3/2022 | Liu | G11C 16/3459 |
| 2016/0005479 A1 * | 1/2016 | Lee | G11C 11/5642 |
| | | | 365/185.12 |
| 2016/0267999 A1 * | 9/2016 | Takeyama | G11C 16/0483 |
| 2019/0392909 A1 * | 12/2019 | Yang | G11C 16/32 |
| 2022/0108749 A1 * | 4/2022 | Joe | G11C 16/32 |
| 2022/0310182 A1 * | 9/2022 | Dong | G11C 16/0433 |

* cited by examiner

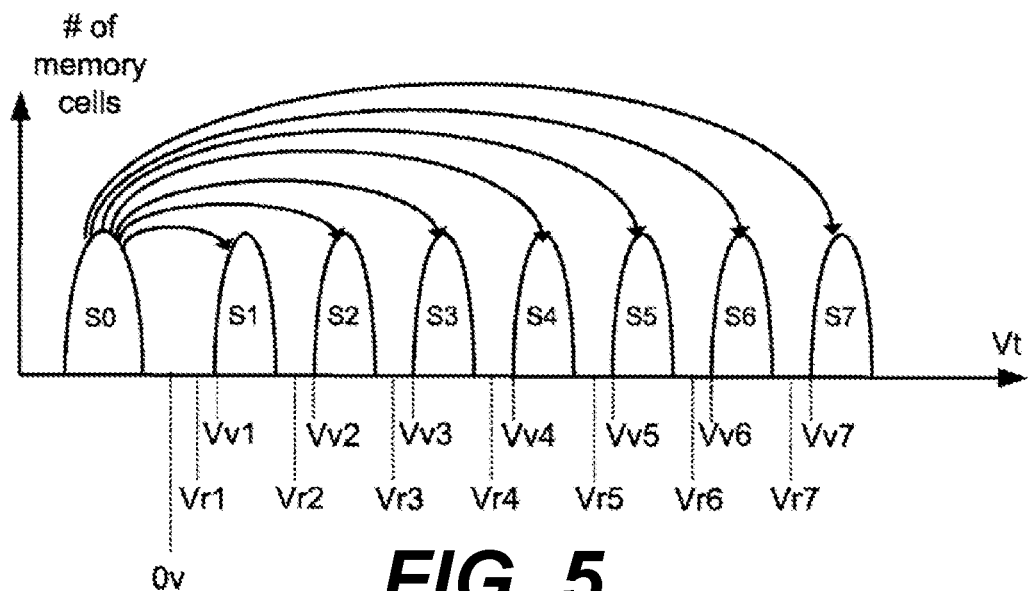
FIG. 5
|  | S0 | S1 | S2 | S3 | S4 | S5 | S6 | S7 |
|---|---|---|---|---|---|---|---|---|
| Upper Page | 1 | 1 | 1 | 0 | 0 | 0 | 0 | 1 |
| Middle Page | 1 | 1 | 0 | 0 | 1 | 1 | 0 | 0 |
| Lower Page | 1 | 0 | 0 | 0 | 0 | 1 | 1 | 1 |
FIG. 6
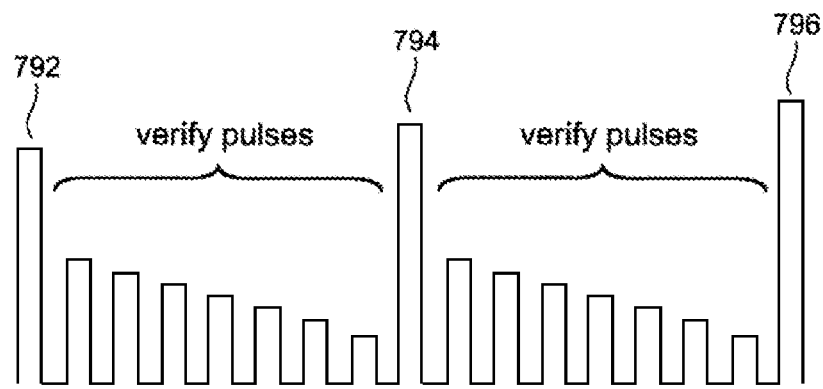
FIG. 7C

TWO-SIDE STAIRCASE PRE-CHARGE IN SUB-BLOCK MODE OF THREE-TIER NON-VOLATILE MEMORY ARCHITECTURE

FIELD

This application relates to non-volatile memory apparatuses and the operation of non-volatile memory apparatuses.

BACKGROUND

This section provides background information related to the technology associated with the present disclosure and, as such, is not necessarily prior art.

Semiconductor memory is widely used in various electronic devices such as cellular telephones, digital cameras, personal digital assistants, medical electronics, mobile computing devices, servers, solid state drives, non-mobile computing devices and other devices. Semiconductor memory may comprise non-volatile memory or volatile memory. A non-volatile memory allows information to be stored and retained even when the non-volatile memory is not connected to a source of power (e.g., a battery).

As memory structures increase in density, it becomes more challenging to maintain the integrity of the data being stored.

SUMMARY

This section provides a general summary of the present disclosure and is not a comprehensive disclosure of its full scope or all of its features and advantages.

An object of the present disclosure is to provide a memory apparatus and a method of operating the memory apparatus that address and overcome the above-noted shortcomings.

Accordingly, it is an aspect of the present disclosure to provide a memory apparatus including memory cells each connected to one of a plurality of word lines. The memory cells are disposed in strings and configured to retain a threshold voltage corresponding to one of a plurality of data states. A control means is coupled to the plurality of word lines and the strings and is configured to ramp a voltage applied to a selected one of the plurality of word lines from a verify voltage to a reduced voltage during at least one program-verify portion of at least one program loop of a program operation. The control means is also configured to successively ramp voltages applied to each of a plurality of neighboring ones of the plurality of word lines from a read pass voltage to the reduced voltage beginning with ones of the plurality of neighboring ones of the plurality of word lines immediately adjacent the selected one of the plurality of word lines and progressing to others of the plurality of neighboring ones of the plurality of word lines disposed increasingly remotely from the selected one of the plurality of word lines during the at least one program-verify portion of the at least one program loop of the program operation.

According to another aspect of the disclosure, a controller in communication with a memory apparatus including memory cells each connected to one of a plurality of word lines is also provided. The memory cells are disposed in strings and configured to retain a threshold voltage corresponding to one of a plurality of data states. The controller is configured to instruct the memory apparatus to ramp a voltage applied to a selected one of the plurality of word lines from a verify voltage to a reduced voltage during at least one program-verify portion of at least one program loop of a program operation. The controller is also configured to instruct the memory apparatus to successively ramp voltages applied to each of a plurality of neighboring ones of the plurality of word lines from a read pass voltage to the reduced voltage beginning with ones of the plurality of neighboring ones of the plurality of word lines immediately adjacent the selected one of the plurality of word lines and progressing to others of the plurality of neighboring ones of the plurality of word lines disposed increasingly remotely from the selected one of the plurality of word lines during the at least one program-verify portion of the at least one program loop of the program operation.

According to an additional aspect of the disclosure a method of operating a memory apparatus is provided. The memory apparatus includes memory cells each connected to one of a plurality of word lines is also provided. The memory cells are disposed in strings and configured to retain a threshold voltage corresponding to one of a plurality of data states. The method includes the step of ramping a voltage applied to a selected one of the plurality of word lines from a verify voltage to a reduced voltage during at least one program-verify portion of at least one program loop of a program operation. The method also includes the step of successively ramping voltages applied to each of a plurality of neighboring ones of the plurality of word lines from a read pass voltage to the reduced voltage beginning with ones of the plurality of neighboring ones of the plurality of word lines immediately adjacent the selected one of the plurality of word lines and progressing to others of the plurality of neighboring ones of the plurality of word lines disposed increasingly remotely from the selected one of the plurality of word lines during the at least one program-verify portion of the at least one program loop of the program operation.

Further areas of applicability will become apparent from the description provided herein. The description and specific examples in this summary are intended for purposes of illustration only and are not intended to limit the scope of the present disclosure.

DRAWINGS

The drawings described herein are for illustrative purposes only of selected embodiments and not all possible implementations, and are not intended to limit the scope of the present disclosure.

FIG. 5 depicts threshold voltage distributions according to aspects of the disclosure;

FIG. 6 is a table describing one example of an assignment of data values to data states according to aspects of the disclosure;

FIG. 7C depicts a word line voltage during programming and verify operations according to aspects of the disclosure;

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

Figure 1:
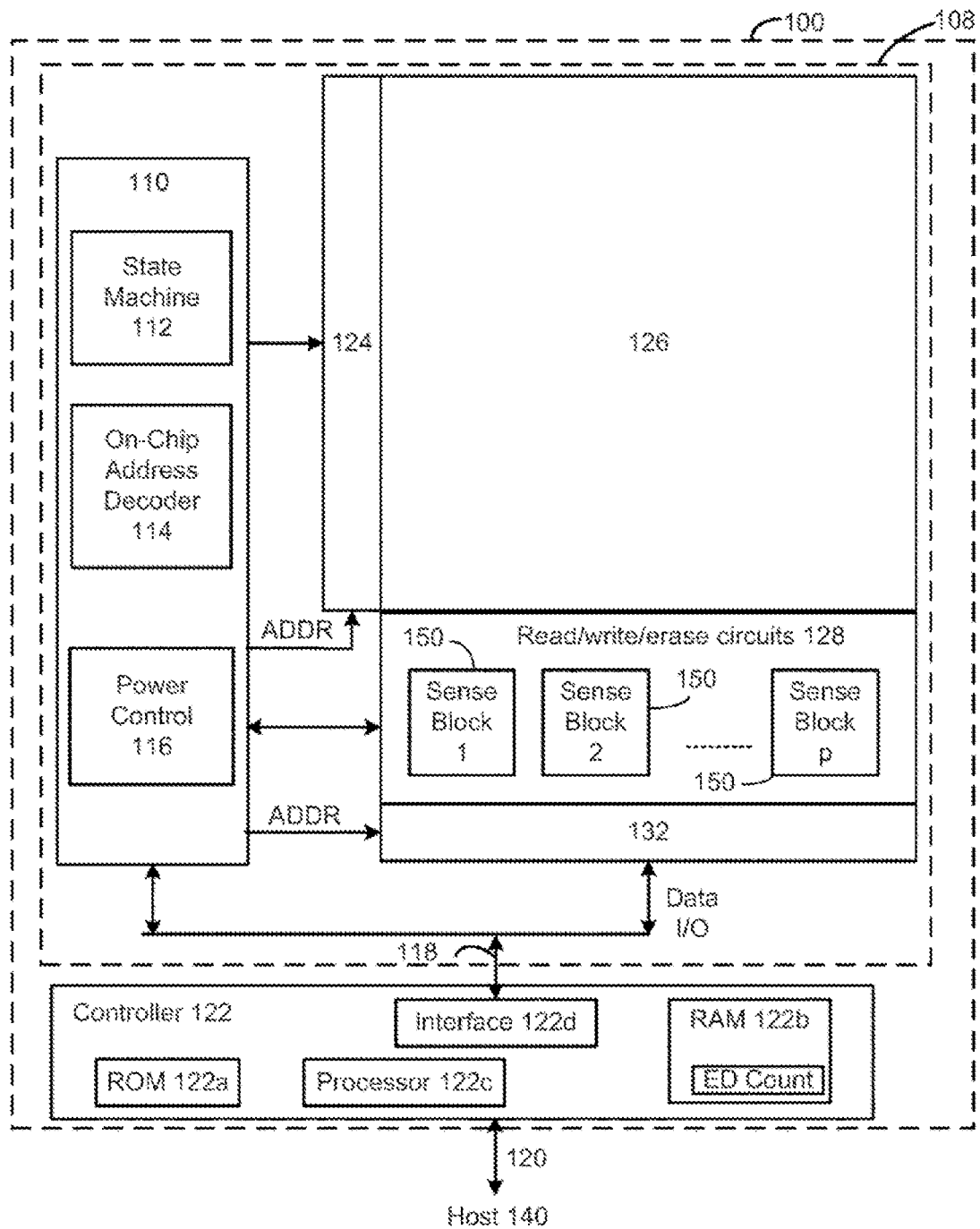
FIG. 1 is a functional block diagram of a memory device according to aspects of the disclosure.

In the following description, details are set forth to provide an understanding of the present disclosure. In some instances, certain circuits, structures and techniques have not been described or shown in detail in order not to obscure the disclosure.

In general, the present disclosure relates to non-volatile memory apparatuses of the type well-suited for use in many applications. The non-volatile memory apparatus and associated methods of operation of this disclosure will be described in conjunction with one or more example embodiments. However, the specific example embodiments disclosed are merely provided to describe the inventive concepts, features, advantages and objectives with sufficient clarity to permit those skilled in this art to understand and practice the disclosure. Specifically, the example embodiments are provided so that this disclosure will be thorough, and will fully convey the scope to those who are skilled in the art. Numerous specific details are set forth such as examples of specific components, devices, and methods, to provide a thorough understanding of embodiments of the present disclosure. It will be apparent to those skilled in the art that specific details need not be employed, that example embodiments may be embodied in many different forms and that neither should be construed to limit the scope of the disclosure. In some example embodiments, well-known processes, well-known device structures, and well-known technologies are not described in detail.

Data stored in non-volatile memory can degrade over time. This can be due to a number causes, such as charge leakage in memory cells whose data state is based on a stored charge level. Data degradation on one memory cell can result from memory operations performed on other memory cells. For example, reading or writing of data in one memory cell places stress on nearby memory cells that can lead to a read or write "disturbs" on these nearby memory cells that can alter their data states. Erase operations can also lead to an erase disturb on nearby memory cells not being erased.

For example, in a two-dimensional array of charge storing non-volatile memory cells, an erase operation for a block of memory cells typically involves setting the control gates of the block's memory cells to low voltage or ground and applying a high erase voltage to the well structure under the array, thereby removing charge stored in the block's memory cells. In a three dimensional (3D) NAND array (such as the BiCS structure) of charge storing non-volatile memory cells, the memory cells of the block again have their control gates set to a low voltage or ground, and the erase voltage is applied to the source lines of the NAND strings for the block from the well structure under the block.

Some memory structures allow for a partial block erase. To take a particular example discussed below, a 3D NAND memory is configured such that memory cells of either a top half sub-block or a bottom half sub-block can be erased, while the other sub-block is not selected for erase. This can be done by allowing the word lines of the non-selected sub-block to float, while the word lines of the selected sub-block are held to an erase enable voltage of ground or other low voltage level. When the erase voltage is then applied to the channel of the NAND strings, the potential difference across the charge storing region in the selected sub-block reduces the amount of stored charge. As the word lines of the non-selected sub-block are left to float, the word line levels are pulled up so these cells are not erased, or at least not to the same degree as for the selected cells. Even though the non-selected cells are not subjected to the same stress as the erase selected cells, the voltage levels involved can lead to a non-negligible amount of erase disturb. As the amount of disturb accumulates over the course of repeated erase operations, this can eventually lead to the data no longer being readable.

Similarly, 3D NAND memory can also be configured such that memory cells of either a top half sub-block or a bottom half sub-block can be programmed, while the other sub-block is not selected for programming. In order to allow the channel or string to conduct, a pre-charge voltage may be applied to word lines, for example, following a program-verify operation. The sub-blocks may physically be arranged in a stack, with one or more sub-blocks, each comprising a tier of the memory apparatus, stacked vertically on top of one another. Because of how the sub-blocks are physically arranged, the memory cells may be required to be programmed in a specific order (either normal order program or reverse order program) depending on a pre-charge path available to each sub-block. However, when there are more than two tiers or if it is desired to program the memory cells in a different order, difficulties related to program-disturb and lower threshold voltage margins may arise. The following presents schemes for the management of such difficulties in non-volatile memory systems that allow sub-block level programming.

FIGS. 1-4F describe one set of examples of a memory system that can be used to implement the technology proposed herein. FIG. 1 is a functional block diagram of an example memory device. The components depicted in FIG. 1 are electrical circuits. Memory device 100 includes one or more memory die 108. Each memory die 108 includes a three dimensional memory structure 126 of memory cells (such as, for example, a 3D array of memory cells), control circuitry 110, and read/write/erase circuits 128. In other embodiments, a two dimensional array of memory cells can be used. Memory structure 126 is addressable by-word lines via a row decoder 124 and by bit lines via a column decoder 132. The read/write/erase circuits 128 include multiple sense blocks 150 including Sense Block 1, Sense Block 2, . . . , Sense Block p (sensing circuitry) and allow a page of memory cells (connected to the same word line) to be read or programmed in parallel. In some systems, a controller 122 is included in the same memory device 100 as the one or more memory die 108. However, in other systems, the controller can be separated from the memory die 108. In some embodiments controller 122 will be on a different die than memory die 108. In some embodiments, one controller 122 will communicate with multiple memory die 108. In other embodiments, each memory die 108 has its own controller. Commands and data are transferred between the host 140 and controller 122 via a data bus 120, and between controller 122 and the one or more memory die 108 via lines 118. In one embodiment, memory die 108 includes a set of input and/or output (I/O) pins that connect to lines 118.

Memory structure 126 may comprise one or more arrays of memory cells including a 3D array. The memory structure may comprise a monolithic three dimensional memory structure in which multiple memory levels are formed above (and not in) a single substrate, such as a wafer, with no intervening substrates. The memory structure may comprise any type of non-volatile memory that is monolithically formed in one or more physical levels of arrays of memory cells having an active area disposed above a silicon substrate. The memory structure may be in a non-volatile memory device having circuitry associated with the operation of the memory cells, whether the associated circuitry is above or within the substrate. In one embodiment, memory structure 126 implements three dimensional NAND flash memory. Other embodiments include two dimensional NAND flash memory, two dimensional NOR flash memory, ReRAM cross-point memories, magnetoresistive memory (e.g., MRAM), phase change memory (e.g., PCRAM), and others.

Control circuitry 110 cooperates with the read/write/erase circuits 128 to perform memory operations (e.g., erase, program, read, and others) on memory structure 126, and includes a state machine 112, an on-chip address decoder 114, and a power control module 116. The state machine 112 provides die-level control of memory operations, such as programming different memory cells to different final targets for a common data state based on distance to an edge of a word line layer. In one embodiment, state machine 112 is programmable by the software. In other embodiments, state machine 112 does not use software and is completely implemented in hardware (e.g., electrical circuits). In one embodiment, control circuitry 110 includes registers, ROM fuses and other storage devices for storing default values such as base voltages and other parameters.

The on-chip address decoder 114 provides an address interface between addresses used by host 140 or controller 122 to the hardware address used by the decoders 124 and 132. Power control module 116 controls the power and voltages supplied to the word lines and bit lines during memory operations. It can include drivers for word line layers (discussed below) in a 3D configuration, select transistors (e.g., SGS and SGD transistors, described below) and source lines. Power control module 116 may include charge pumps for creating voltages. The sense blocks include bit line drivers. An SGS transistor is a select gate transistor at a source end of a NAND string, and an SGD transistor is a select gate transistor at a drain end of a NAND string.

Any one or any combination of control circuitry 110, state machine 112, decoders 114/124/132, power control module 116, sense blocks 150, read/write/erase circuits 128, and/or controller 122 can be considered a control circuit that performs the functions described herein.

The (on-chip or off-chip) controller 122 (which in one embodiment is an electrical circuit) may comprise one or more processors 122c, ROM 122a, RAM 122b, and Memory Interface 122d, all of which are interconnected. One or more processors 122c is one example of a control circuit. Other embodiments can use state machines or other custom circuits designed to perform one or more functions. The storage devices (ROM 122a, RAM 122b) comprises code such as a set of instructions, and the processor 122c is operable to execute the set of instructions to provide the functionality described below related to programming different memory cells to different final targets for a common data state based on distance to an edge of a word line layer. Alternatively or additionally, processor 122c can access code from a storage device in the memory structure, such as a reserved area of memory cells connected to one or more word lines. Memory interface 122d, in communication with ROM 122a, RAM 122b and processor 122c, is an electrical circuit (electrical interface) that provides an electrical interface between controller 122 and one or more memory die 108. The controller can maintain various operating parameters in RAM 122b, such as the erase disturb counts (ED Count) this are discussed in more detail below. As discussed further below, For example, memory interface 122d can change the format or timing of signals, provide a buffer, isolate from surges, latch I/O, etc. Processor 122c can issue commands to control circuitry 110 (or any other component of memory die 108) via Memory Interface 122d.

Multiple memory elements in memory structure 126 may be configured so that they are connected in series or so that each element is individually accessible. By way of non-limiting example, flash memory devices in a NAND configuration (NAND flash memory) typically contain memory elements connected in series. A NAND string is an example of a set of series-connected memory cells and select gate transistors.

A NAND flash memory array may be configured so that the array is composed of multiple NAND strings of which a NAND string is composed of multiple memory cells sharing a single bit line and accessed as a group. Alternatively, memory elements may be configured so that each element is individually accessible, e.g., a NOR memory array. NAND and NOR memory configurations are exemplary, and memory cells may be otherwise configured.

The memory cells may be arranged in the single memory device level in an ordered array, such as in a plurality of rows and/or columns. However, the memory elements may be arrayed in non-regular or non-orthogonal configurations, or in structures not considered arrays.

A three dimensional memory array is arranged so that memory cells occupy multiple planes or multiple memory device levels, thereby forming a structure in three dimensions (i.e., in the x, y and z directions, where the z direction is substantially perpendicular and the x and y directions are substantially parallel to the major surface of the substrate).

As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in they direction) with each column having multiple memory cells. The vertical columns may be arranged in a two dimensional configuration, e.g., in an x-y plane, resulting in a three dimensional arrangement of memory cells, with memory cells on multiple vertically stacked memory planes. Other configurations of memory elements in three dimensions can also constitute a three dimensional memory array.

By way of non-limiting example, in a three dimensional NAND memory array, the memory elements may be coupled together to form vertical NAND strings that traverse across multiple horizontal levels. Other three dimensional configurations can be envisioned wherein some NAND strings contain memory elements in a single memory level while other strings contain memory elements which span through multiple memory levels. Three dimensional memory arrays may also be designed in a NOR configuration and in a ReRAM configuration.

A person of ordinary skill in the art will recognize that the technology described herein is not limited to a single specific memory structure, but covers many relevant memory structures within the spirit and scope of the technology as described herein and as understood by one of ordinary skill in the art.

Figure 2:
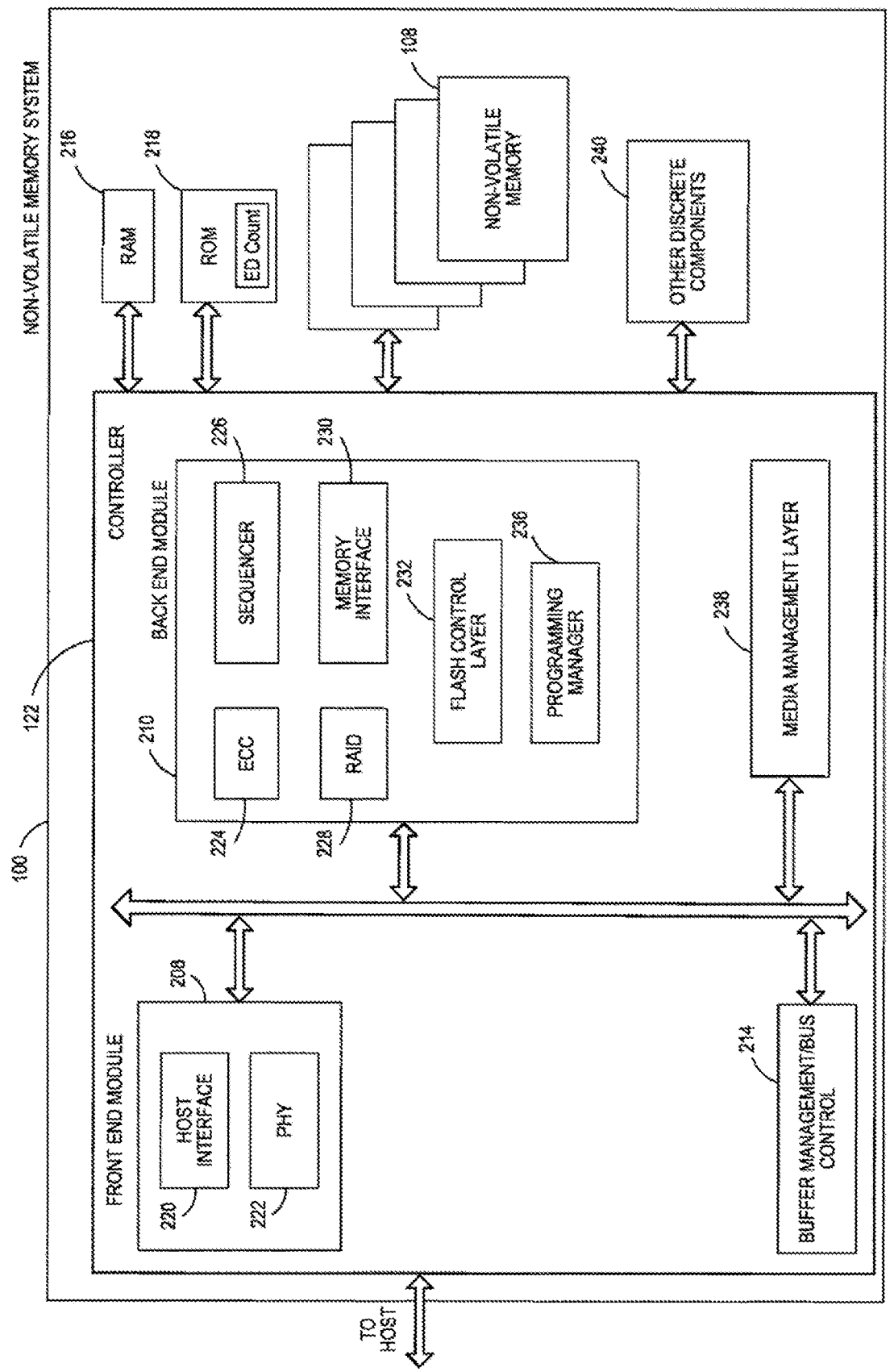
FIG. 2 is a block diagram depicting one embodiment of a memory system according to aspects of the disclosure.

FIG. 2 is a block diagram of example memory system 100, depicting more details of one embodiment of controller 122. As used herein, a flash memory controller is a device that manages data stored on flash memory and communicates with a host, such as a computer or electronic device. A flash memory controller can have various functionality in addition to the specific functionality described herein. For example, the flash memory controller can format the flash memory to ensure the memory is operating properly, map out bad flash memory cells, and allocate spare memory cells to be substituted for future failed cells. Some part of the spare cells can be used to hold firmware to operate the flash memory controller and implement other features. In operation, when a host needs to read data from or write data to the flash memory, it will communicate with the flash memory controller. If the host provides a logical address to which data is to be read/written, the flash memory controller can convert the logical address received from the host to a physical address in the flash memory. (Alternatively, the host can provide the physical address). The flash memory controller can also perform various memory management functions, such as, but not limited to, wear leveling (distributing writes to avoid wearing out specific blocks of memory that would otherwise be repeatedly written to) and garbage collection (after a block is full, moving only the valid pages of data to a new block, so the full block can be erased and reused).

The interface between controller 122 and non-volatile memory die 108 may be any suitable flash interface, such as Toggle Mode 200, 400, or 800. In one embodiment, memory system 100 may be a card based system, such as a secure digital (SD) or a micro secure digital (micro-SD) card. In an alternate embodiment, memory system 100 may be part of an embedded memory system. For example, the flash memory may be embedded within the host. In other example, memory system 100 can be in the form of a solid state drive (SSD) drive.

In some embodiments, non-volatile memory system 100 includes a single channel between controller 122 and non-volatile memory die 108, the subject matter described herein is not limited to having a single memory channel. For example, in some memory system architectures, 2, 4, 8 or more channels may exist between the controller and the memory die, depending on controller capabilities. In any of the embodiments described herein, more than a single channel may exist between the controller and the memory die, even if a single channel is shown in the drawings.

As depicted in FIG. 2, controller 112 includes a front end module 208 that interfaces with a host, a back end module 210 that interfaces with the one or more non-volatile memory die 108, and various other modules that perform functions which will now be described in detail.

The components of controller 122 depicted in FIG. 2 may take the form of a packaged functional hardware unit (e.g., an electrical circuit) designed for use with other components, a portion of a program code (e.g., software or firmware) executable by a (micro) processor or processing circuitry that usually performs a particular function of related functions, or a self-contained hardware or software component that interfaces with a larger system, for example. For example, each module may include an application specific integrated circuit (ASIC), a Field Programmable Gate Array (FPGA), a circuit, a digital logic circuit, an analog circuit, a combination of discrete circuits, gates, or any other type of hardware or combination thereof. Alternatively or in addition, each module may include software stored in a processor readable device (e.g., memory) to program a processor for controller 122 to perform the functions described herein. The architecture depicted in FIG. 2 is one example implementation that may (or may not) use the components of controller 122 depicted in FIG. 1 (i.e. RAM, ROM, processor, interface).

Referring again to modules of the controller 122, a buffer manager/bus control 214 manages buffers in random access memory (RAM) 216 and controls the internal bus arbitration of controller 122. A read only memory (ROM) 218 stores system boot code. Although illustrated in FIG. 2 as located separately from the controller 122, in other embodiments one or both of the RAM 216 and ROM 218 may be located within the controller. Among the other information stored in RAM 216, the erase disturb counts (ED Count) that are discussed in more detail below are again explicitly represented. In yet other embodiments, portions of RAM and ROM may be located both within the controller 122 and outside the controller. Further, in some implementations, the controller 122, RAM 216, and ROM 218 may be located on separate semiconductor die.

Front end module 208 includes a host interface 220 and a physical layer interface (PHY) 222 that provide the electrical interface with the host or next level storage controller. The choice of the type of host interface 220 can depend on the type of memory being used. Examples of host interfaces 220 include, but are not limited to, SATA, SATA Express, SAS, Fibre Channel, USB, PCIe, and NVMe. The host interface 220 typically facilitates transfer for data, control signals, and timing signals.

Back end module 210 includes an error correction code (ECC) engine 224 that encodes the data bytes received from the host, and decodes and error corrects the data bytes read from the non-volatile memory. A command sequencer 226 generates command sequences, such as program and erase command sequences, to be transmitted to non-volatile memory die 108. A RAID (Redundant Array of Independent Dies) module 228 manages generation of RAID parity and recovery of failed data. The RAID parity may be used as an additional level of integrity protection for the data being written into the non-volatile memory system 100. In some cases, the RAID module 228 may be a part of the ECC engine 224. Note that the RAID parity may be added as an extra die or dies as implied by the common name, but it may also be added within the existing die, e.g. as an extra plane, or extra block, or extra WLs within a block. A memory interface 230 provides the command sequences to non-volatile memory die 108 and receives status information from non-volatile memory die 108. In one embodiment, memory interface 230 may be a double data rate (DDR) interface, such as a Toggle Mode 200, 400, or 800 interface. A flash control layer 232 controls the overall operation of back end module 210.

One embodiment includes a programming manager 236, which can be used to manage (in conjunction with the circuits on the memory die) the programming of memory cells closer to an edge of the word line layer and memory cells further from the edge of the word line layer to a first data state representing first data such that the memory cells closer to the edge of the word line layer are programmed to a first final threshold voltage distribution using a first final verify level and the memory cells further from the edge of the word line layer are programmed to a second final threshold voltage distribution using a second verify level, where the second verify level is lower than the first verify level and the second final threshold voltage distribution is lower in voltage than the first threshold voltage distribution. For example, in one embodiment, programming manager 236 may perform and/or manage the processes of FIGS. 7A, 12, 14 and 15, described below. More details of programming manager 236 are also provided below with respect to those figures. Programming manager 236 can be an electrical circuit, a set of one or more software modules, or a combination of a circuit and software.

Additional components of system 100 illustrated in FIG. 2 include media management layer 238, which performs wear leveling of memory cells of non-volatile memory die 108. System 100 also includes other discrete components 240, such as external electrical interfaces, external RAM, resistors, capacitors, or other components that may interface with controller 122. In alternative embodiments, one or more of the physical layer interface 222, RAID module 228, media management layer 238 and buffer management/bus controller 214 are optional components that are not necessary in the controller 122.

The Flash Translation Layer (FTL) or Media Management Layer (MML) 238 may be integrated as part of the flash management that may handle flash errors and interfacing with the host. In particular, MML may be a module in flash management and may be responsible for the internals of NAND management. In particular, the MML 238 may include an algorithm in the memory device firmware which translates writes from the host into writes to the flash memory 126 of die 108. The MML 238 may be needed because: 1) the flash memory may have limited endurance; 2) the flash memory 126 may only be written in multiples of pages; and/or 3) the flash memory 126 may not be written unless it is erased as a block. The MML 238 understands these potential limitations of the flash memory 126 which may not be visible to the host. Accordingly, the MML 238 attempts to translate the writes from host into writes into the flash memory 126. As described below, erratic bits may be identified and recorded using the MML 238. This recording of erratic bits can be used for evaluating the health of blocks and/or word lines (the memory cells on the word lines).

Controller 122 may interface with one or more memory dies 108. In one embodiment, controller 122 and multiple memory dies (together comprising non-volatile storage system 100) implement a solid state drive (SSD), which can emulate, replace or be used instead of a hard disk drive inside a host, as a NAS device, in a laptop, in a tablet, in a server, etc. Additionally, the SSD need not be made to work as a hard drive.

Some embodiments of a non-volatile storage system will include one memory die 108 connected to one controller 122. However, other embodiments may include multiple memory die 108 in communication with one or more controllers 122. In one example, the multiple memory die can be grouped into a set of memory packages. Each memory package includes one or more memory die in communication with controller 122. In one embodiment, a memory package includes a printed circuit board (or similar structure) with one or more memory die mounted thereon. In some embodiments, a memory package can include molding material to encase the memory dies of the memory package. In some embodiments, controller 122 is physically separate from any of the memory packages.

Figure 3:
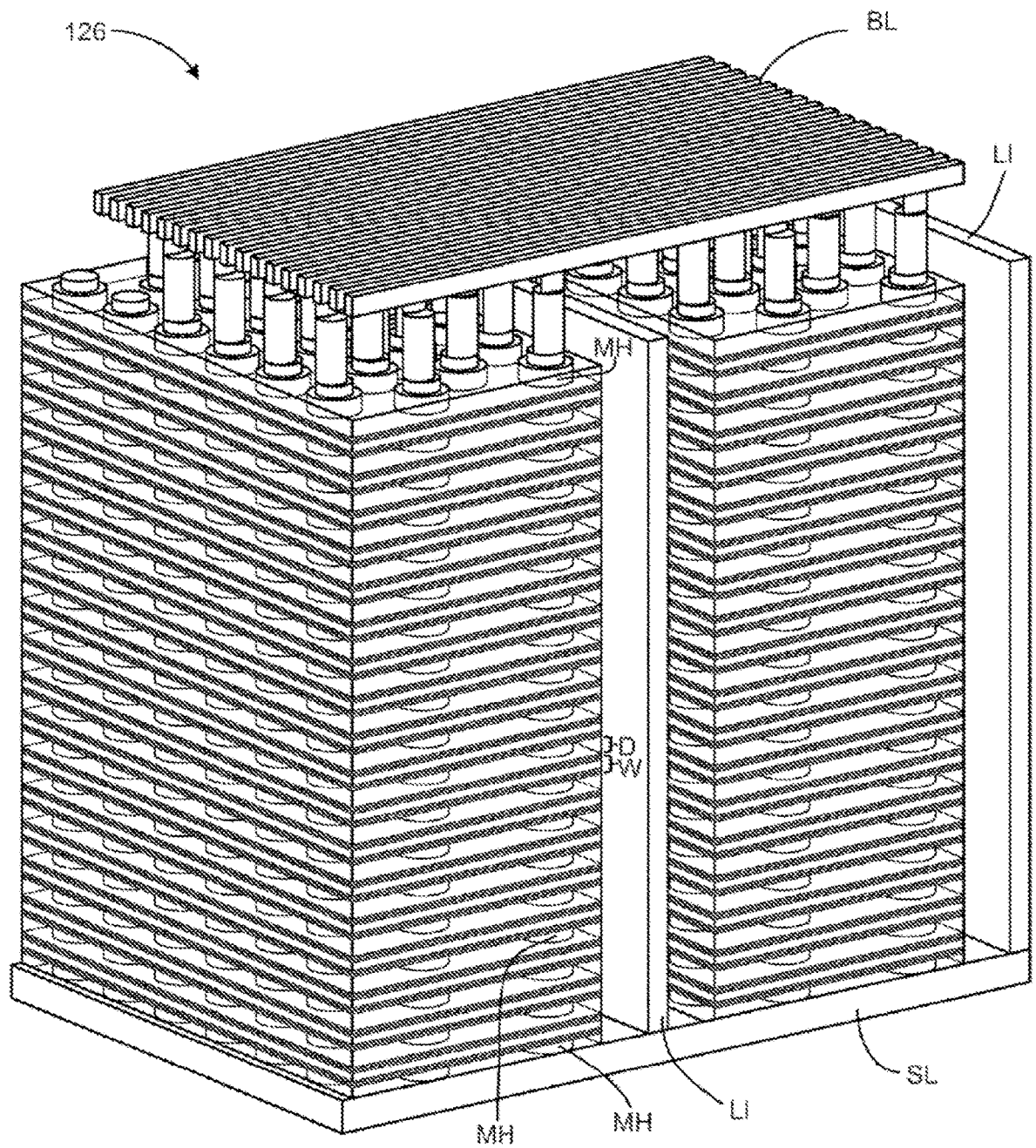
FIG. 3 is a perspective view of a portion of one embodiment of a monolithic three dimensional memory structure according to aspects of the disclosure.

FIG. 3 is a perspective view of a portion of one example embodiment of a monolithic three dimensional memory structure 126, which includes a plurality memory cells. For example, FIG. 3 shows a portion of one block of memory. The structure depicted includes a set of bit lines BL positioned above a stack of alternating dielectric layers and conductive layers. For example purposes, one of the dielectric layers is marked as D and one of the conductive layers (also called word line layers) is marked as W. The number of alternating dielectric layers and conductive layers can vary based on specific implementation requirements. One set of embodiments includes between 108-216 alternating dielectric layers and conductive layers, for example, 96 data word line layers, 8 select layers, 4 dummy word line layers and 108 dielectric layers. More or less than 108-216 layers can also be used. As will be explained below, the alternating dielectric layers and conductive layers are divided into four "fingers" by local interconnects LI (isolation areas). FIG. 3 only shows two fingers and two local interconnects LI. Below the alternating dielectric layers and word line layers is a source line layer SL. Memory holes are formed in the stack of alternating dielectric layers and conductive layers. For example, one of the memory holes is marked as MK Note that in FIG. 3, the dielectric layers are depicted as see-through so that the reader can see the memory holes positioned in the stack of alternating dielectric layers and conductive layers. In one embodiment, NAND strings are formed by filling the memory hole with materials including a charge-trapping layer to create a vertical column of memory cells. Each memory cell can store one or more bits of data. More details of the three dimensional monolithic memory structure 126 is provided below with respect to FIG. 4A-4F.

Figure 4A:
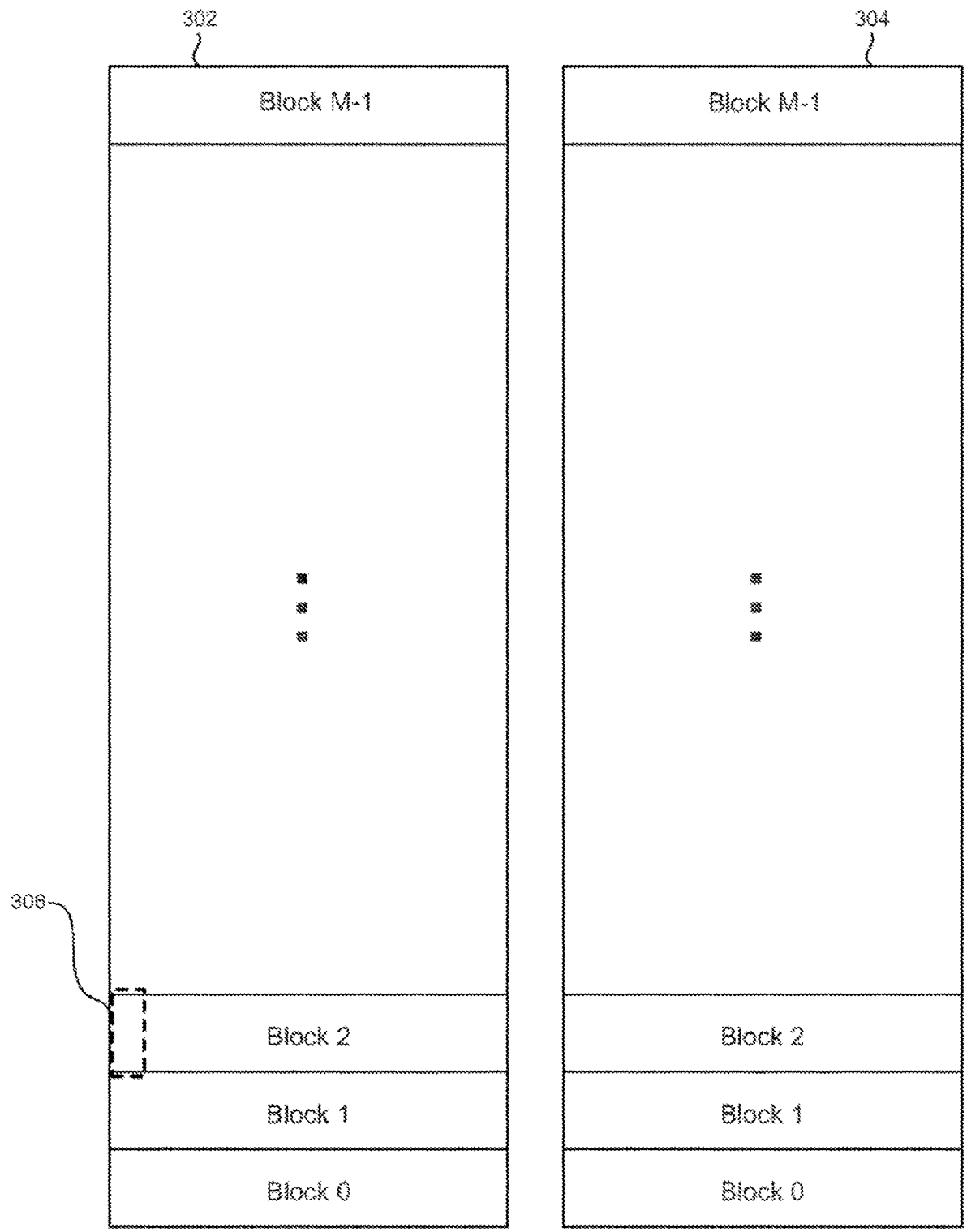
FIG. 4A is a block diagram of a memory structure having two planes according to aspects of the disclosure.

FIG. 4A is a block diagram explaining one example organization of memory structure 126, which is divided into two planes 302 and 304. Each plane is then divided into M blocks. In one example, each plane has about 2000 blocks. However, different numbers of blocks and planes can also be used. In one embodiment, for two plane memory, the block IDs are usually such that even blocks belong to one plane and odd blocks belong to another plane; therefore, plane 302 includes block 0, 2, 4, 6, . . . and plane 304 includes blocks 1, 3, 5, 7, . . . In on embodiment, a block of memory cells is a unit of erase. That is, all memory cells of a block are erased together. In other embodiments, memory cells can be grouped into blocks for other reasons, such as to organize the memory structure 126 to enable the signaling and selection circuits.

Figure 4B:
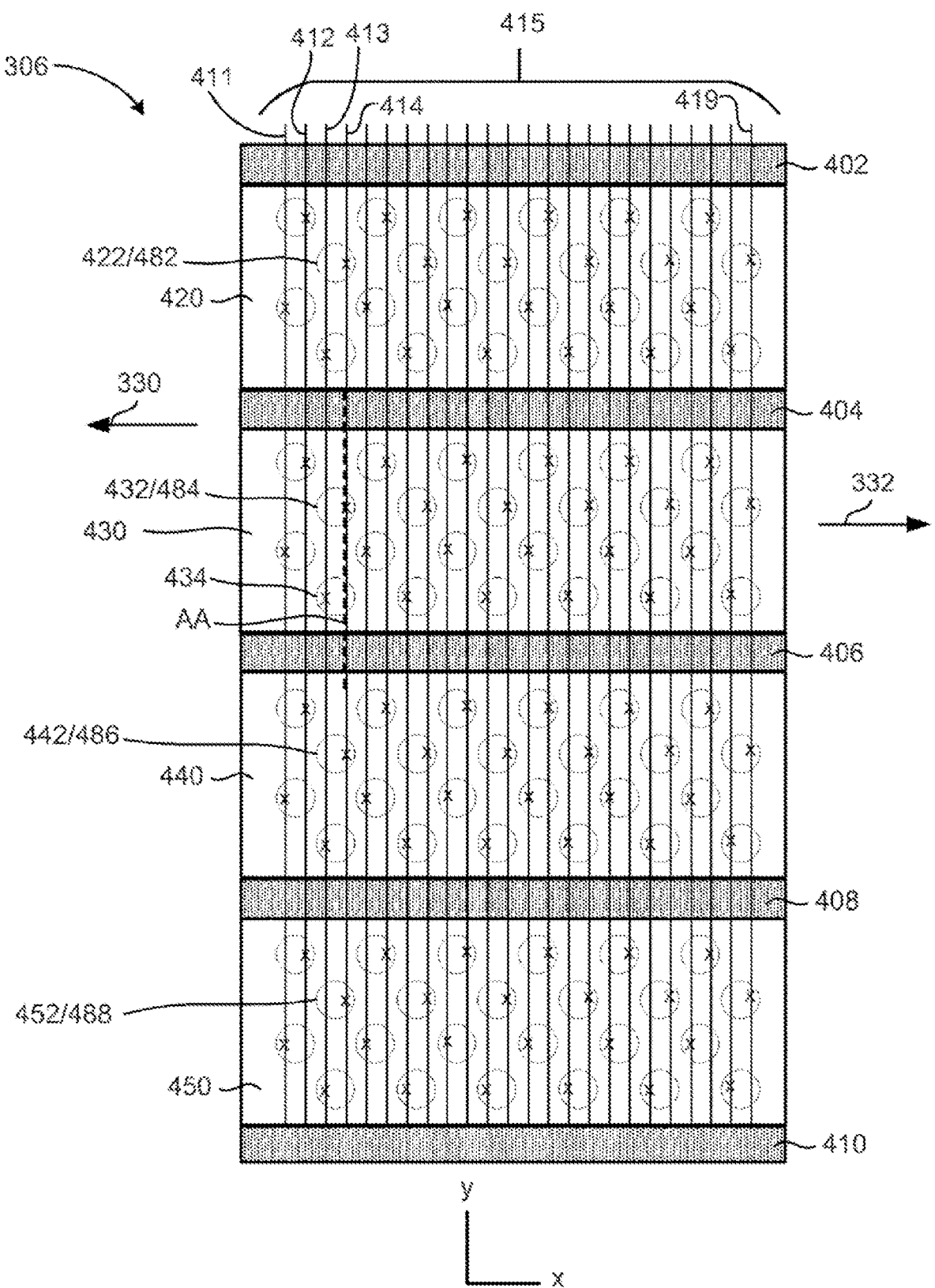
FIG. 4B depicts a top view of a portion of a block of memory cells according to aspects of the disclosure.

FIGS. 4B-4F depict an example 3D NAND structure. FIG. 4B is a block diagram depicting a top view of a portion of one block from memory structure 126. The portion of the block depicted in FIG. 4B corresponds to portion 306 in block 2 of FIG. 4A. As can be seen from FIG. 4B, the block depicted in FIG. 4B extends in the direction of 332. In one embodiment, the memory array will have 60 layers. Other embodiments have less than or more than 60 layers. However, FIG. 4B only shows the top layer.

FIG. 4B depicts a plurality of circles that represent the vertical columns. Each of the vertical columns include multiple select transistors and multiple memory cells. In one embodiment, each vertical column implements a NAND string and, therefore, can be referred to as a memory column. A memory column can implement other types of memory in addition to NAND. FIG. 4B depicts vertical columns 422, 432, 442 and 452. Vertical column 422 implements NAND string 482. Vertical column 432 implements NAND string 484. Vertical column 442 implements NAND string 486. Vertical column 452 implements NAND string 488. More details of the vertical columns are provided below. Since the block depicted in FIG. 4B extends in the direction of arrow 330 and in the direction of arrow 332, the block includes more vertical columns than depicted in FIG. 4B

FIG. 4B also depicts a set of bit lines 415, including bit lines 411, 412, 413, 414, . . . 419. FIG. 4B shows twenty four bit lines because only a portion of the block is depicted. It is contemplated that more than twenty four bit lines connected to vertical columns of the block. Each of the circles representing vertical columns has an "x" to indicate its connection to one bit line. For example, bit line 414 is connected to vertical columns 422, 432, 442 and 452.

The block depicted in FIG. 4B includes a set of isolation areas 402, 404, 406, 408 and 410 that serve to divide each layer of the block into four regions; for example, the top layer depicted in FIG. 4B is divided into regions 420, 430, 440 and 450, which are referred to as fingers. In the layers of the block that implement memory cells, the four regions are referred to as word line fingers that are separated by the isolation areas (also serving as local interconnects). In one embodiment, the word line fingers on a common level of a block connect together at the end of the block to form a single word line. In another embodiment, the word line fingers on the same level are not connected together. In one example implementation, a bit line only connects to one vertical column in each of regions 420, 430, 440 and 450. In that implementation, each block has sixteen rows of active columns and each bit line connects to four rows in each block. In one embodiment, all of four rows connected to a common bit line are connected to the same word line (via different word line fingers on the same level that are connected together); therefore, the system uses the source side selection lines and the drain side selection lines to choose one (or another subset) of the four to be subjected to a memory operation (program, verify, read, and/or erase).

Isolation areas 402, 404, 406, 408 and 410 also connect the various layers to a source line below the vertical columns. In one embodiment, isolation areas 402, 404, 406, 408 and 410 are filled with a layer of $SiO_2$ (blocking) and a layer of poly-silicon (source line connection).

Although FIG. 4B shows each region having four rows of vertical columns, four regions and sixteen rows of vertical columns in a block, those exact numbers are an example implementation. Other embodiments may include more or less regions per block, more or less rows of vertical columns per region and more or less rows of vertical columns per block.

FIG. 4B also shows the vertical columns being staggered. In other embodiments, different patterns of staggering can be used. In some embodiments, the vertical columns are not staggered.

Figure 4C:
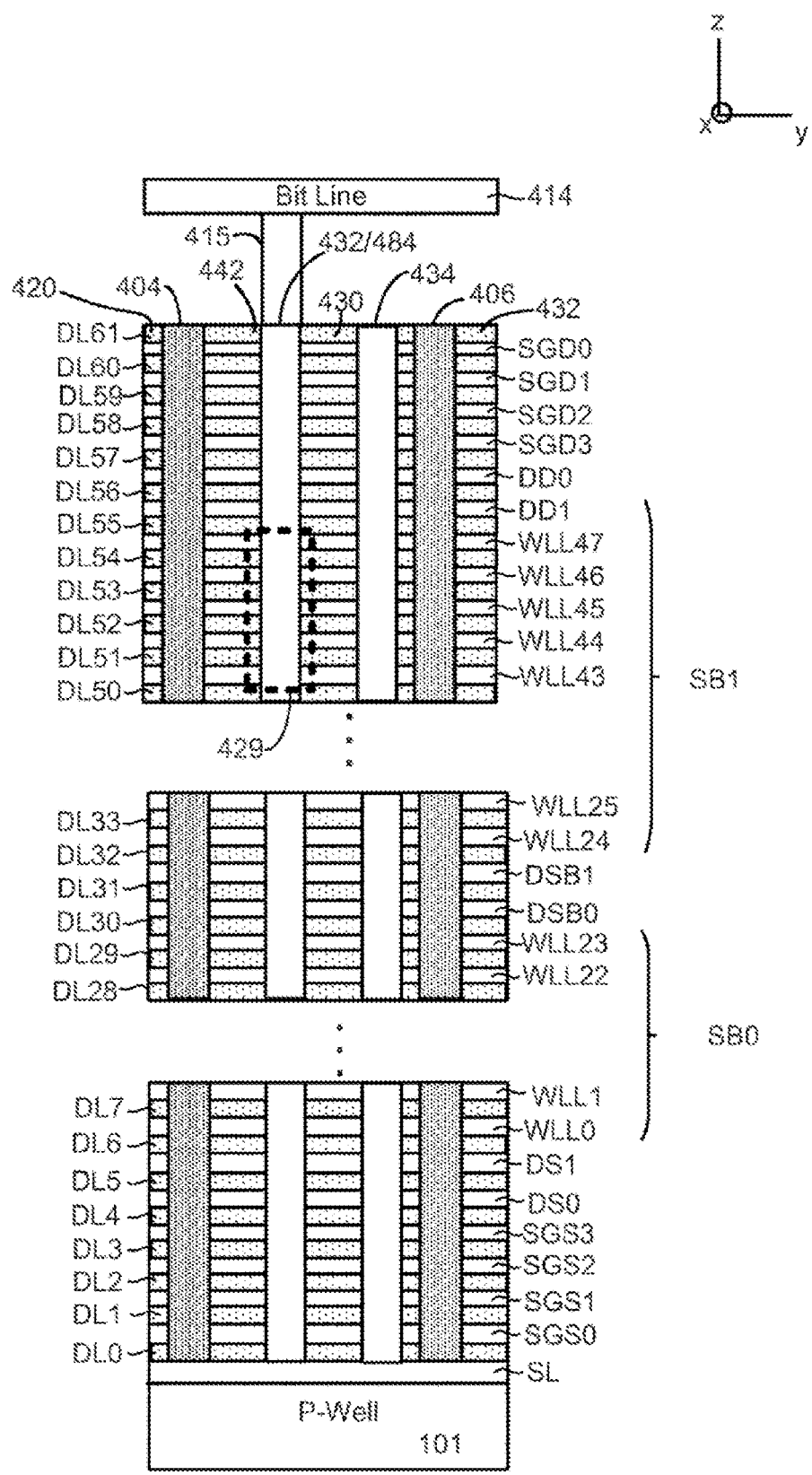
FIG. 4C depicts a cross sectional view of a portion of a block of memory cells according to aspects of the disclosure.

FIG. 4C depicts a portion of an embodiment of three dimensional memory structure 126 showing a cross-sectional view along line AA of FIG. 4B. This cross sectional view cuts through vertical columns 432 and 434 and region 430 (see FIG. 4B). The structure of FIG. 4C includes four drain side select layers SGD0, SGD1, SGD2 and SGD3; four source side select layers SGS0, SGS1, SGS2 and SGS3; four dummy word line layers DD0, DD1, DS0 and DS1; and forty eight data word line layers WLL0-WLL47 for connecting to data memory cells. Other embodiments can implement more or less than four drain side select layers, more or less than four source side select layers, more or less than four dummy word line layers, and more or less than forty eight word line layers (e.g., 96 word line layers). Vertical columns 432 and 434 are depicted protruding through the drain side select layers, source side select layers, dummy word line layers and word line layers. In one embodiment, each vertical column comprises a NAND string. For example, vertical column 432 comprises NAND string 484. The NAND string of vertical column 432 has a source end at a bottom of the stack and a drain end at a top of the stack. As in agreement with FIG. 4B, FIG. 4C show vertical column 432 connected to Bit Line 414 via connector 415. Isolation areas 404 and 406 are also depicted. Below the vertical columns and the layers listed below, and over the underlying substrate, is source line SL and well region P-Well 101. A block of memory cells will share a common well region and in an erase operation, the erase voltage Verase is applied to the P-Well 101 and, through the source line SL, to channel region of the vertical columns.

For ease of reference, drain side select layers SGD0, SGD1, SGD2 and SGD3; source side select layers SGS0, SGS1, SGS2 and SGS3; dummy word line layers DD0, DD1, DS0 and DS1; and word line layers WLL0-WLL47 collectively are referred to as the conductive layers. In one embodiment, the conductive layers are made from a combination of TiN and Tungsten. In other embodiments, other materials can be used to form the conductive layers, such as doped polysilicon, metal such as Tungsten or metal silicide. In some embodiments, different conductive layers can be formed from different materials. Between conductive layers are dielectric layers DL0-DL61. For example, dielectric layers DL51 is above word line layer WLL43 and below word line layer WLL44. In one embodiment, the dielectric layers are made from $SiO_2$. In other embodiments, other dielectric materials can be used to form the dielectric layers.

The non-volatile memory cells are formed along vertical columns which extend through alternating conductive and dielectric layers in the stack. In one embodiment, the memory cells are arranged in NAND strings. The word line layer WLL0-WLL47 connect to memory cells (also called data memory cells). Dummy word line layers DD0, DD1, DS0 and DS1 connect to dummy memory cells. A dummy memory cell does not store host data (data provided from the host, such as data from a user of the host), while a data memory cell is eligible to store host data. Drain side select layers SGD0, SGD1, SGD2 and SGD3 are used to electrically connect and disconnect NAND strings from bit lines. Source side select layers SGS0, SGS1, SGS2 and SGS3 are used to electrically connect and disconnect NAND strings from the source line SL.

To increase the density of data storage, block size can be increased by including more layers of word lines, increasing the height of the memory structure in the z-direction. As block size increases, this can lead to issues with block yield, block budget, the efficiency and speed of data allocation, and garbage collection. In some embodiments, a sub-block structure can be introduced to help address these issues by allowing erase and program at the sub-block level. FIG. 4C illustrates an example where the block is split into an upper sub-block SB1 and a lower sub-block SB1. Other embodiments can use larger numbers of sub-blocks. In FIG. 4C, lower sub-block SB0 includes word lines layers WLL0-WLL23 and upper sub-block includes word line layers WLL24-WLL47. In the embodiment of FIG. 4C, the sub-blocks are separated by a pair of dummy word lines DSB0 and DSB1. Other embodiments may have more or less dummy word lines between sub-blocks and may additionally or alternatively include a non-programmable sub-block junction transistor of a different size or structure than the memory cell transistors.

Figure 4D:
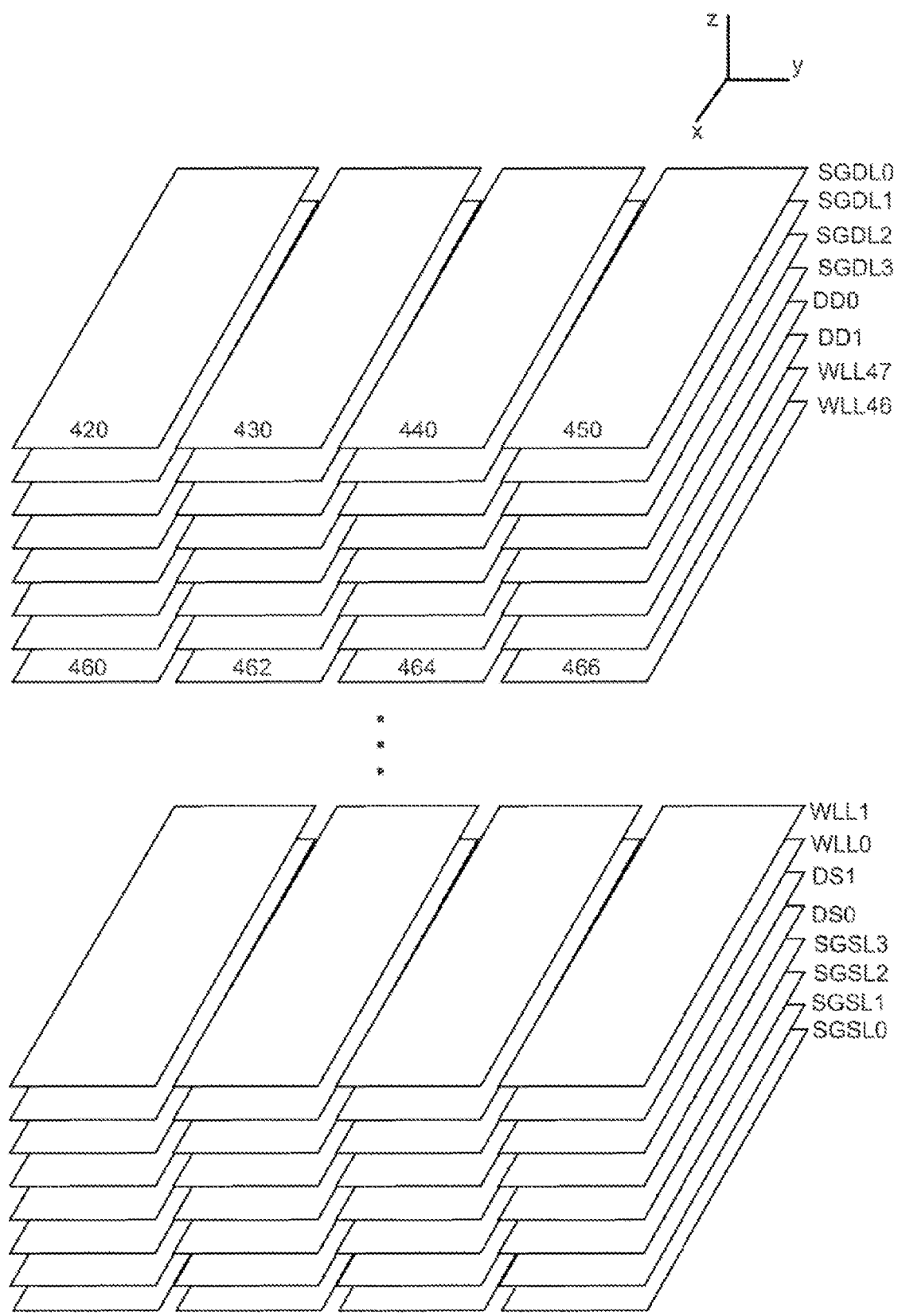
FIG. 4D depicts a view of the select gate layers and word line layers according to aspects of the disclosure.

FIG. 4D depicts a logical representation of the conductive layers (SGD0, SGD1, SGD2, SGD3, SGS0, SGS1, SGS2, SGS3, DD0, DD1, DS0, DS1, and WLL0-WLL47) for the block that is partially depicted in FIG. 4C. As mentioned above with respect to FIG. 4B, in one embodiment isolation areas 402, 404, 406, 408 and 410 break up each conductive layers into four regions or fingers. For example, word line layer WLL31 is divided into regions 460, 462, 464 and 466. For word line layers (WLL0-WLL31), the regions are referred to as word line fingers; for example, word line layer WLL46 is divided into word line fingers 460, 462, 464 and 466. In one embodiment, the four word line fingers on a same level are connected together. In another embodiment, each word line finger operates as a separate word line. The word lines can again be split into multiple sub-blocks.

Drain side select gate layer SGD0 (the top layer) is also divided into regions 420, 430, 440 and 450, also known as fingers or select line fingers. In one embodiment, the four select line fingers on a same level are connected together. In another embodiment, each select line finger operates as a separate word line.

Figure 4E:
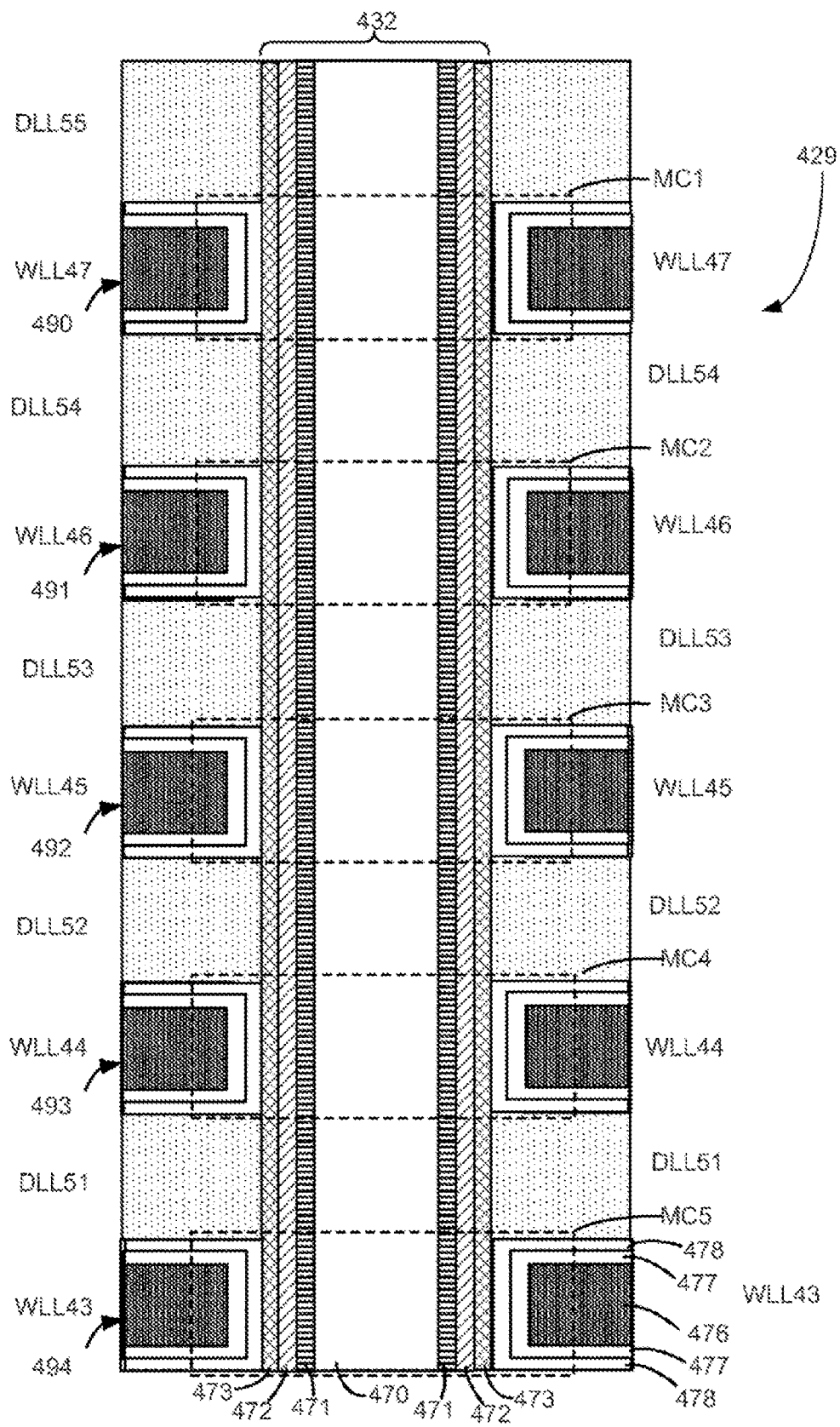
FIG. 4E is a cross sectional view of a vertical column of memory cells according to aspects of the disclosure.

FIG. 4E depicts a cross sectional view of region 429 of FIG. 4C that includes a portion of vertical column 432. In one embodiment, the vertical columns are round and include four layers; however, in other embodiments more or less than four layers can be included and other shapes can be used. In one embodiment, vertical column 432 includes an inner core layer 470 that is made of a dielectric, such as $SiO_2$. Other materials can also be used. Surrounding inner core 470 is polysilicon channel 471. Materials other than polysilicon can also be used. Note that it is the channel 471 that connects to the bit line. Surrounding channel 471 is a tunneling dielectric 472. In one embodiment, tunneling dielectric 472 has an ONO structure. Surrounding tunneling dielectric 472 is charge trapping layer 473, such as (for example) Silicon Nitride. Other memory materials and structures can also be used. The technology described herein is not limited to any particular material or structure.

FIG. 4E depicts dielectric layers DLL51, DLL52, DLL53, DLL54 and DLL55, as well as word line layers WLL43, WLL44, WLL45, WLL46, and WLL47. Each of the word line layers includes a word line region 476 surrounded by an aluminum oxide layer 477, which is surrounded by a blocking oxide ($SiO_2$) layer 478. The physical interaction of the word line layers with the vertical column forms the memory cells. Thus, a memory cell, in one embodiment, comprises channel 471, tunneling dielectric 472, charge trapping layer 473, blocking oxide layer 478, aluminum oxide layer 477 and word line region 476. For example, word line layer WLL47 and a portion of vertical column 432 comprise a memory cell MC1. Word line layer WLL46 and a portion of vertical column 432 comprise a memory cell MC2. Word line layer WLL45 and a portion of vertical column 432 comprise a memory cell MC3. Word line layer WLL44 and a portion of vertical column 432 comprise a memory cell MC4. Word line layer WLL43 and a portion of vertical column 432 comprise a memory cell MC5. In other architectures, a memory cell may have a different structure; however, the memory cell would still be the storage unit.

When a memory cell is programmed, electrons are stored in a portion of the charge trapping layer 473 which is associated with the memory cell. These electrons are drawn into the charge trapping layer 473 from the channel 471, through the tunneling dielectric 472, in response to an appropriate voltage on word line region 476. The threshold voltage (Vth) of a memory cell is increased in proportion to the amount of stored charge. In one embodiment, the programming is achieved through Fowler-Nordheim tunneling of the electrons into the charge trapping layer. During an erase operation, the electrons return to the channel or holes are injected into the charge trapping layer to recombine with electrons. In one embodiment, erasing is achieved using hole injection into the charge trapping layer via a physical mechanism such as gate induced drain leakage (GIDL).

Figure 4F:
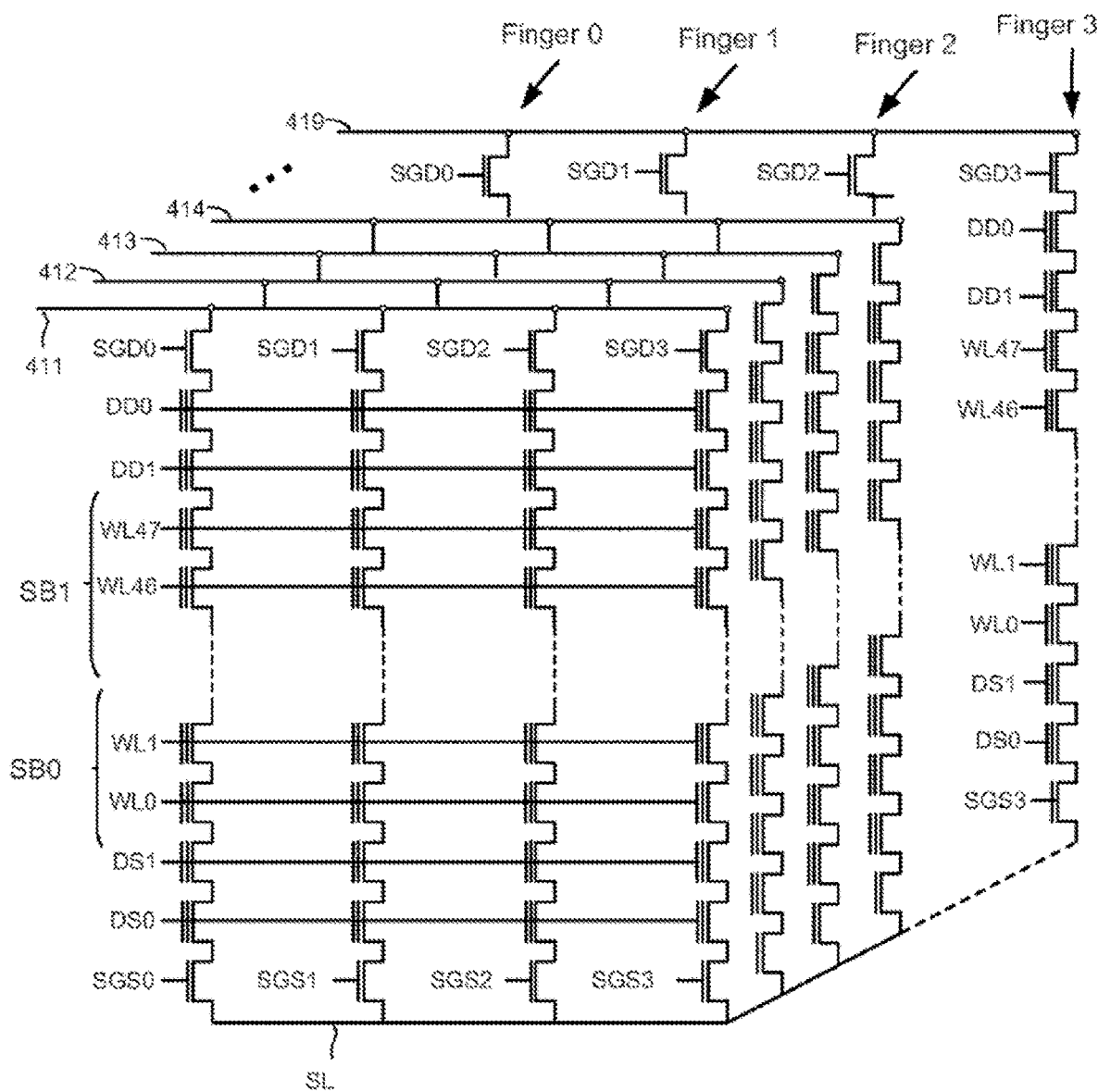
FIG. 4F is a schematic of a plurality of NAND strings according to aspects of the disclosure.

FIG. 4F shows physical word lines WLL0-WLL47 running across the entire block. The structure of FIG. 4G corresponds to portion 306 in Block 2 of FIGS. 4A-F, including bit lines 411, 412, 413, 414, . . . 419. Within the block, each bit line connected to four NAND strings. Drain side selection lines SGD0, SGD1, SGD2 and SGD3 are used to determine which of the four NAND strings connect to the associated bit line. The block can also be thought of as divided into four fingers finger 0, finger 1, finger 2 and finger 3. Finger 0 corresponds to those vertical NAND strings controlled by SGD0 and SGS0, finger 1 corresponds to those vertical NAND strings controlled by SGD1 and SGS1, finger 2 corresponds to those vertical NAND strings controlled by SGD2 and SGS2, and finger 3 corresponds to those vertical NAND strings controlled by SGD3 and SGS3. The example of FIG. 4F again shows the separation into upper sub-block SB1 and lower sub-block SB0, but the intermediate dummy word lines DSB0 and DSB0 in FIG. 4C are not explicitly represented.

Although the example memory system of FIGS. 4A-4F is a three dimensional memory structure that includes vertical NAND strings with charge-trapping material, other (2D and 3D) memory structures can also be used with the technology described herein. For example, floating gate memories (e.g., NAND-type and NOR-type flash memory ReRAM memories, magnetoresistive memory (e.g., MRAM), and phase change memory (e.g., PCRAM) can also be used.

One example of a ReRAM memory includes reversible resistance-switching elements arranged in cross point arrays accessed by X lines and Y lines (e.g., word lines and bit lines). In another embodiment, the memory cells may include conductive bridge memory elements. A conductive bridge memory element may also be referred to as a programmable metallization cell. A conductive bridge memory element may be used as a state change element based on the physical relocation of ions within a solid electrolyte. In some cases, a conductive bridge memory element may include two solid metal electrodes, one relatively inert (e.g., tungsten) and the other electrochemically active (e.g., silver or copper), with a thin film of the solid electrolyte between the two electrodes. As temperature increases, the mobility of the ions also increases causing the programming threshold for the conductive bridge memory cell to decrease. Thus, the conductive bridge memory element may have a wide range of programming thresholds over temperature.

Magnetoresistive memory (MRAM) stores data by magnetic storage elements. The elements are formed from two ferromagnetic plates, each of which can hold a magnetization, separated by a thin insulating layer. One of the two plates is a permanent magnet set to a particular polarity; the other plate's magnetization can be changed to match that of an external field to store memory. This configuration is known as a spin valve and is the simplest structure for an MRAM bit. A memory device is built from a grid of such memory cells. In one embodiment for programming, each memory cell lies between a pair of write lines arranged at right angles to each other, parallel to the cell, one above and one below the cell. When current is passed through them, an induced magnetic field is created.

Phase change memory (PCRAM) exploits the unique behavior of chalcogenide glass. One embodiment uses a GeTe—Sb2Te3 super lattice to achieve non-thermal phase changes by simply changing the co-ordination state of the Germanium atoms with a laser pulse (or light pulse from another source). Therefore, the doses of programming are laser pulses. The memory cells can be inhibited by blocking the memory cells from receiving the light. Note that the use of "pulse" in this document does not require a square pulse, but includes a (continuous or non-continuous) vibration or burst of sound, current, voltage light, or other wave.

The memory systems discussed above can be erased, programmed and read. At the end of a successful programming process (with verification), the threshold voltages of the memory cells should be within one or more distributions of threshold voltages for programmed memory cells or within a distribution of threshold voltages for erased memory cells, as appropriate. FIG. 5 illustrates example threshold voltage distributions for the memory cell array when each memory cell stores three bits of data. Other embodiments, however, may use other data capacities per memory cell (e.g., such as one, two, four, or five bits of data per memory cell). FIG. 5 shows eight threshold voltage distributions, corresponding to eight data states. The first threshold voltage distribution (data state) S0 represents memory cells that are erased. The other seven threshold voltage distributions (data states) S1-S17 represent memory cells that are programmed and, therefore, are also called programmed states. Each threshold voltage distribution (data state) corresponds to predetermined values for the set of data bits. The specific relationship between the data programmed into the memory cell and the threshold voltage levels of the cell depends upon the data encoding scheme adopted for the cells. In one embodiment, data values are assigned to the threshold voltage ranges using a Gray code assignment so that if the threshold voltage of a memory erroneously shifts to its neighboring physical state, only one bit will be affected.

FIG. 5 also shows seven read reference voltages, Vr1, Vr2, Vr3, Vr4, Vr5, Vr6, and Vr7, for reading data from memory cells. By testing (e.g., performing sense operations) whether the threshold voltage of a given memory cell is above or below the seven read reference voltages, the system can determine what data state (i.e., S0, S1, S2, S3, ... ) a memory cell is in.

FIG. 5 also shows seven verify reference voltages, Vv1, Vv2, Vv3, Vv4, Vv5, Vv6, and Vv7. When programming memory cells to data state S1, the system will test whether those memory cells have a threshold voltage greater than or equal to Vv1. When programming memory cells to data state S2, the system will test whether the memory cells have threshold voltages greater than or equal to Vv2. When programming memory cells to data state S3, the system will determine whether memory cells have their threshold voltage greater than or equal to Vv3. When programming memory cells to data state S4, the system will test whether those memory cells have a threshold voltage greater than or equal to Vv4. When programming memory cells to data state S5, the system will test whether those memory cells have a threshold voltage greater than or equal to Vv5. When programming memory cells to data state S6, the system will test whether those memory cells have a threshold voltage greater than or equal to Vv6. When programming memory cells to data state S7, the system will test whether those memory cells have a threshold voltage greater than or equal to Vv7. While FIG. 5 shows only data state S0 (i.e., erased) below 0 volts, it should be understood that other data states beside data state S0 (e.g., data states S1 and/or S2) may also be below 0 volts (i.e., negative word line).

In one embodiment, known as full sequence programming, memory cells can be programmed from the erased data state S0 directly to any of the programmed data states S1-S7. For example, a population of memory cells to be programmed may first be erased so that all memory cells in the population are in erased data state S0. Then, a programming process is used to program memory cells directly into data states S1, S2, S3, S4, S5, S6, and/or S7. For example, while some memory cells are being programmed from data state S0 to data state S1, other memory cells are being programmed from data state S0 to data state S2 and/or from data state S0 to data state S3, and so on. The arrows of FIG. 6 represent the full sequence programming. The technology described herein can also be used with other types of programming in addition to full sequence programming (including, but not limited to, multiple stage/phase programming). In some embodiments, data states S1-S7 can overlap, with controller 122 relying on ECC to identify the correct data being stored.

FIG. 6 is a table describing one example of an assignment of data values to data states. In the table of FIG. 6, S0=111. S1=110, S2=200, S3=000, S4=010, S5=011, S6=001 and S7=101. Other encodings of data can also be used. No particular data encoding is required by the technology disclosed herein.

In one embodiment, when a block is subjected to an erase operation, all memory cells are moved to data state S0, the erased state. As discussed further below, when the memory structure allows sub-block, erase selected sub-blocks of a physical block are erased while non-selected sub-blocks are not. In the embodiment of FIG. 6, all bits stored in a memory cell are 1 when the memory cells is erased (e.g., in data state S0).

Figure 7A:
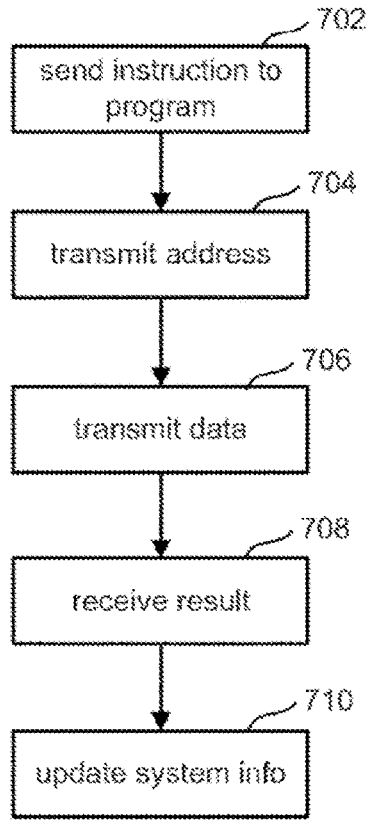
FIG. 7A is a flow chart describing one embodiment of a process for programming according to aspects of the disclosure.

FIG. 7A is a flowchart describing one embodiment of a process for programming that is performed by controller 122. In some embodiments, rather than have a dedicated controller, the host can perform the functions of the controller. In step 702, controller 122 sends instructions to one or more memory die 108 to program data. In step 704, controller 122 sends one or more addresses to one or more memory die 108. The one or more logical addresses indicate where to program the data. In step 706, controller 122 sends the data to be programmed to the one or more memory die 108. In step 708, controller 122 receives a result of the programming from the one or more memory die 108. Example results include that the data was programmed successfully, an indication that the programming operation failed, and indication that the data was programmed but at a different location, or other result. In step 710, in response to the result received in step 708, controller 122 updates the system information that it maintains. In one embodiment, the system maintains tables of data that indicate status information for each block. This information may include a mapping of logical addresses to physical addresses, which blocks/word lines are open/closed (or partially opened/closed), which blocks/word lines are bad, etc.

In some embodiments, before step 702, controller 122 would receive host data and an instruction to program from the host, and the controller would run the ECC engine 224 to create code words from the host data, as known in the art and described in more detail below. These code words are the data transmitted in step 706. controller can also scramble the data to achieve wear leveling with respect to the memory cells.

Figure 7B:
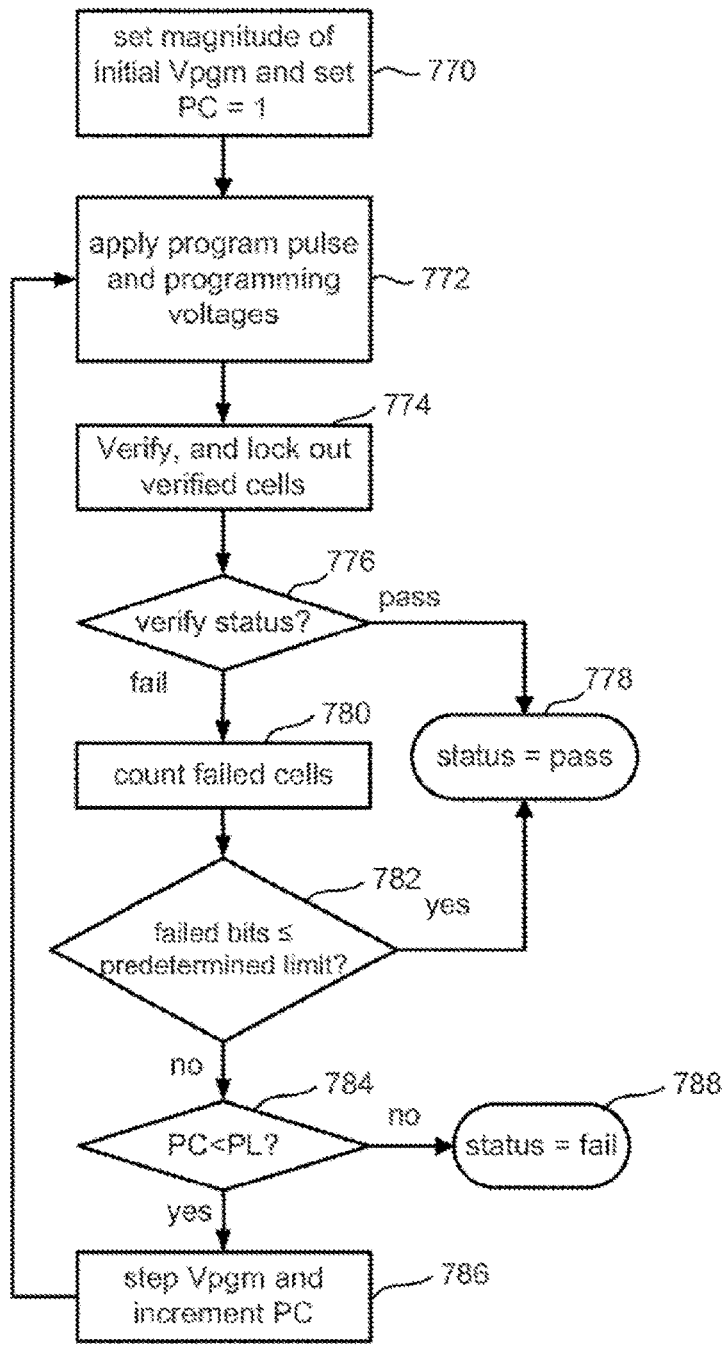
FIG. 7B is a flow chart describing one embodiment of a process for programming data into memory cells connected to a common word line according to aspects of the disclosure.

FIG. 7B is a flowchart describing one embodiment of a process for programming. The process of FIG. 7B is performed by the memory die in response to the steps of FIG. 7A (i.e., in response to the instructions, data and addresses from controller 122). In one example embodiment, the process of FIG. 7B is performed on memory die 108 using the one or more control circuits discussed above, at the direction of state machine 112. The process of FIG. 7B can also be used to implement the full sequence programming discussed above. Additionally, the process of FIG. 7B can be used to implement each phase of a multi-phase programming process.

Typically, the program voltage applied to the control gates (via a selected word line) during a program operation is applied as a series of program pulses. Between programming pulses are a set of verify pulses to perform verification. In many implementations, the magnitude of the program pulses is increased with each successive pulse by a predetermined step size. In step 770 of FIG. 7B, the programming voltage (Vpgm) is initialized to the starting magnitude (e.g., ~12-16V or another suitable level) and a program counter PC maintained by state machine 112 is initialized at 1. In step 772, a program pulse of the program signal Vpgm is applied to the selected word line (the word line selected for programming). In one embodiment, the group of memory cells being programmed concurrently are all connected to the same word line (the selected word line). The unselected word lines receive one or more boosting voltages (e.g., ~7-11 volts) to perform boosting schemes known in the art. If a memory cell should be programmed, then the corresponding bit line is grounded. On the other hand, if the memory cell should remain at its current threshold voltage, then the corresponding bit line is connected to Vdd to inhibit programming. In step 772, the program pulse is concurrently applied to all memory cells connected to the selected word line so that all of the memory cells connected to the selected word line are programmed concurrently. That is, they are programmed at the same time or during overlapping times (both of which are considered concurrent). In this manner, all of the memory cells connected to the selected word line will concurrently have their threshold voltage change, unless they have been locked out from programming.

In step 774, the appropriate memory cells are verified using the appropriate set of verify reference voltages to perform one or more verify operations. In one embodiment, the verification process is performed by applying the testing whether the threshold voltages of the memory cells selected for programming have reached the appropriate verify reference voltage.

In step 776, it is determined whether all the memory cells have reached their target threshold voltages (pass). If so, the programming process is complete and successful because all selected memory cells were programmed and verified to their target states. A status of "PASS" is reported in step 778. If, in 776, it is determined that not all of the memory cells have reached their target threshold voltages (fail), then the programming process continues to step 780.

In step 780, the system counts the number of memory cells that have not yet reached their respective target threshold voltage distribution. That is, the system counts the number of memory cells that have, so far, failed the verify process. This counting can be done by the state machine, the controller, or other logic. In one implementation, each of the sense blocks will store the status (pass/fail) of their respective cells. In one embodiment, there is one total count, which reflects the total number of memory cells currently being programmed that have failed the last verify step. In another embodiment, separate counts are kept for each data state.

In step 782, it is determined whether the count from step 780 is less than or equal to a predetermined limit. In one embodiment, the predetermined limit is the number of bits that can be corrected by error correction codes (ECC) during a read process for the page of memory cells. If the number of failed memory cells is less than or equal to the predetermined limit, than the programming process can stop and a status of "PASS" is reported in step 778. In this situation, enough memory cells programmed correctly such that the few remaining memory cells that have not been completely programmed can be corrected using ECC during the read process. In some embodiments, step 780 will count the number of failed cells for each sector, each target data state or other unit, and those counts will individually or collectively be compared to a threshold in step 782.

In another embodiment, the predetermined limit can be less than the number of bits that can be corrected by ECC during a read process to allow for future errors. When programming less than all of the memory cells for a page, or comparing a count for only one data state (or less than all states), than the predetermined limit can be a portion (pro-rata or not pro-rata) of the number of bits that can be corrected by ECC during a read process for the page of memory cells. In some embodiments, the limit is not predetermined. Instead, it changes based on the number of errors already counted for the page, the number of program-erase cycles performed or other criteria.

If number of failed memory cells is not less than the predetermined limit, than the programming process continues at step 784 and the program counter PC is checked against the program limit value (PL). Examples of program limit values include 12, 20 and 30; however, other values can be used. If the program counter PC is not less than the program limit value PL, then the program process is considered to have failed and a status of FAIL is reported in step 788. This is one example of a program fault. If the program counter PC is less than the program limit value PL, then the process continues at step 786 during which time the Program Counter PC is incremented by 1 and the program voltage Vpgm is stepped up to the next magnitude. For example, the next pulse will have a magnitude greater than the previous pulse by a step size (e.g., a step size of 0.1-0.5 volts). After step 786, the process loops back to step 772 and another program pulse is applied to the selected word line so that another iteration (steps 772-786) of the programming process of FIG. 7B is performed.

In general, during verify operations and read operations, the selected word line is connected to a voltage (one example of a reference signal), a level of which is specified for each read operation (e.g., see read reference voltages Vr1, Vr2, Vr3, Vr4, Vr5, Vr6, and Vr7, of FIG. 5) or verify operation (e.g. see verify reference voltages Vv1, Vv2, Vv3, Vv4, Vv5, Vv6, and Vv7 of FIG. 5) in order to determine whether a threshold voltage of the concerned memory cell has reached such level. After applying the word line voltage, the conduction current of the memory cell is measured to determine whether the memory cell turned on (conducted current) in response to the voltage applied to the word line. If the conduction current is measured to be greater than a certain value, then it is assumed that the memory cell turned on and the voltage applied to the word line is greater than the threshold voltage of the memory cell. If the conduction current is not measured to be greater than the certain value, then it is assumed that the memory cell did not turn on and the voltage applied to the word line is not greater than the threshold voltage of the memory cell. During a read or verify process, the unselected memory cells are provided with one or more read pass voltages at their control gates so that these memory cells will operate as pass gates (e.g., conducting current regardless of whether they are programmed or erased).

There are many ways to measure the conduction current of a memory cell during a read or verify operation. In one example, the conduction current of a memory cell is measured by the rate it discharges or charges a dedicated capacitor in the sense amplifier. In another example, the conduction current of the selected memory cell allows (or fails to allow) the NAND string that includes the memory cell to discharge a corresponding bit line. The voltage on the bit line is measured after a period of time to see whether it has been discharged or not. Note that the technology described herein can be used with different methods known in the art for verifying/reading. Other read and verify techniques known in the art can also be used.

In some embodiments, controller 122 receives a request from the host (or a client, user, etc.) to program host data (data received from the host) into the memory system. In some embodiments, controller 122 arranges the host data to be programmed into units of data. For example, controller 122 can arrange the host data into pages, word line units, blocks, jumbo blocks, or other units. For purposes of this document, a block is a physical grouping of memory cells. In one example, a block is a unit of erase. However, in other examples a block need not be a unit of erase. In one example, a block comprises a set of memory cells connected by uninterrupted word lines such as a set of NAND strings connected to a common set of word lines. Other physical arrangement can also be used.

Step 772 of FIG. 7B includes applying a program voltage pulse on the selected word line. Step 774 of FIG. 7B includes verification, which in some embodiments comprises applying the verify reference voltages on the selected word line. As steps 772 and 774 are part of an iterative loop, the program voltage is applied as a series of voltage pulses that step up in magnitude. Between voltage pulses, verify reference voltages are applied. This is depicted in FIG. 7C, which shows program voltage pulses 792, 794 and 796, applied during three successive iterations of step 772. Between program voltage pulses 792, 794 and 796, the system tests the memory cells to determine whether threshold voltages of the memory cells are greater than the respective verify reference voltages by applying the verify references voltages as verify pulses.

Looking back at FIG. 4B, the memory structure is depicted with four rows of memory holes between isolation areas 402, 404, 406, 408 and 410. In some embodiments, when memory cells are further scaled down, one approach is to reduce the number of isolation areas which are used to separate fingers or increase the number of memory holes without increasing the number of isolation areas. The isolation areas are also used to let in etchant to etch away silicon nitride (SiN) layers inside the multiple oxide/nitride layer stack and replace them with tungsten layers which will be used as word line layers. That is when the memory stack is first fabricated, alternating layers of dielectric material (oxide) and silicon nitride are deposited or otherwise laid down. Then the memory holes are created through the alternating layers of oxide/nitride. Various materials that make up the memory holes are then added, as depicted in FIG. 4E. Then the isolation areas are carved into the stack. Subsequently, an etchant is inserted via the insolation areas in order to etch out the silicon nitride. Once the silicon nitride is removed, tungsten is used to replace the silicon nitride. This tungsten will become the word line layers.

If the number of isolation areas is reduced as compared to the number of memory holds, it means more memory holes will exist between every two neighboring isolation areas. This also means larger areas of silicon nitride need to be etched away and replaced by tungsten between every two neighboring isolation areas and, therefore, the silicon nitride etching process will take a longer time. Since the silicon nitride layers surrounding the outer memory holes (memory holes which are closer to the isolation areas) will be etched earlier by the etchant (typically hot phosphoric acid) coming in from vertically etched through isolation areas, while the silicon nitride layers surrounding the inner memory holes (memory holes which are closer to the isolation areas) will be etched later, the dielectric layers ($SiO_2$ layers) inside the outer memory holes will be exposed to the etchant for a longer time. Due to this exposure difference, the $SiO_2$ layers of the outer memory holes will be etched away more than that of the inner memory holes. This will cause thinner dielectric layer thickness inside the outer memory holes which leads to faster memory cell programming and erasing. It will also lead to comparatively thicker dielectric layer thickness for the inner memory holes which leads to slower memory programming and erase speeds.

When programming the memory cells as described above, prior to applying a program pulse at step 772 of FIG. 7B, if a memory cell should be programmed, then the corresponding bit line is grounded. On the other hand, if the memory cell should remain at its current threshold voltage, then the corresponding bit line is connected to a program inhibit level, such as Vdd. In many embodiments, the word lines of an erased block are programmed stating at the source end with word line word line WL0 of FIG. 4A-4F. As the other memory cells of the columns between the selected word line and the bit line are erased, this allows for the level on the bit line to be applied to the memory cells of the selected word line uniformly, whereas if any of the intermediate memory cells were programmed, this pre-charging of the memory cells could be blocked. The word lines of the block are then sequentially written in an order working from the source side on the bottom towards the bit lines at the drain end of the NAND strings. This is illustrated schematically in FIG. 8A.

Figure 8A:
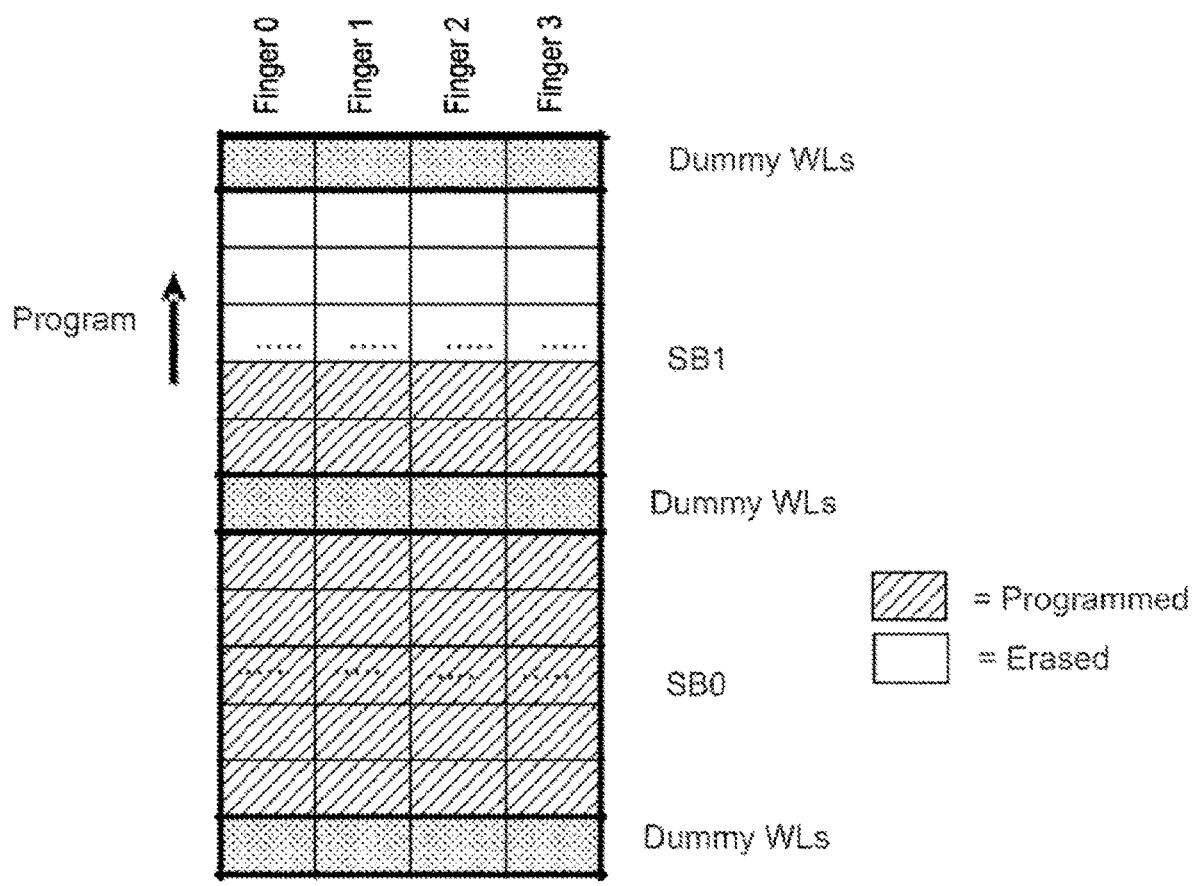
FIGS. 8A and 8B depict examples of word line programming orders for a two sub-block per physical block according to aspects of the disclosure.

FIG. 8A is a simplified version of FIGS. 4A-4F describing one embodiment of a process for programming word lines of a block of memory cells sequentially from the source end (at bottom) towards the drain end. The block is shown at a stage where the lower sub-block SB0 is programmed and the first few word lines of the upper sub-block SB1 have been written. The stippled regions at top represent the select gates and any dummy word lines at the ends of the strings through which the NAND strings are respectively connected to the bit and source lines on either end. The central stippled region represents any dummy word lines between sub-blocks SB0 and SB1, such as DSB0 and DSB1 of FIG. 4C, as well as any junction transistors between the sub-blocks, if these are included in the structure. In many embodiments, the dummy word lines at the source and drain ends, as well as the inter-sub-block dummy word lines, if included, are not rewritten in a standard programming operation.

In embodiments where the memory system allows program and erase at the sub-block level, the state of one sub-block can affect the operation of the other sub-block. Whether or not the lower sub-block SB0 is programmed, the standard programming order illustrated in FIG. 8A can be used on upper sub-block S1 as the lower sub-block SB0 is not between the bit lines and the selected word line. Similarly, if the upper sub-block SB1 is erased, as after a full physical block erase, the standard programming order can be used for the lower sub-block SB0. However, in the case where the upper sub-block SB1 is programmed, but the lower sub-block SB0 has been erased and is to be programmed, the programming order can be altered in some embodiments.

Figure 8B:
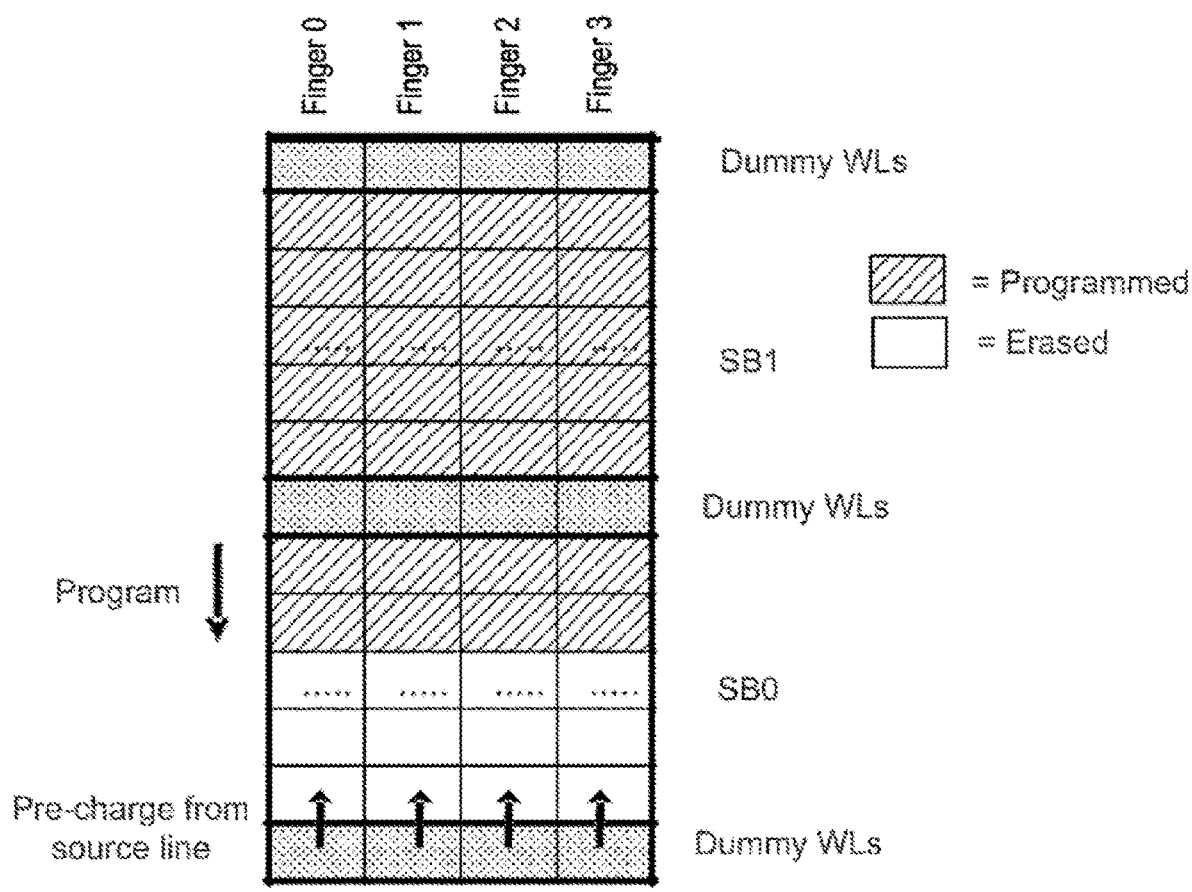

FIG. 8B illustrates the case where the upper sub-block SB1 is programmed and the lower sub-block is to be programmed. The conventional program order (programming up from the source side) for the lower sub-block SB0 creates problems when the upper sub-block SB1 is programmed as the pre-charge from the bit line side is blocked. The conventional order can also lead to serious program disturb concern for the data programmed in the upper sub-block SB1.

To help alleviate these problems, FIG. 8B illustrates an embodiment that uses a reverse, or "mirror" order of programming, where the word lines of the lower sub-block SB0 are programmed sequentially from the middle downwards. The columns can then be pre-charged form the source line, rather than the bit line, to either a program inhibit or program enable level, avoiding the problems that can arise when pre-charging from the top side when the upper sub-block SB1 is programmed.

Figure 9:
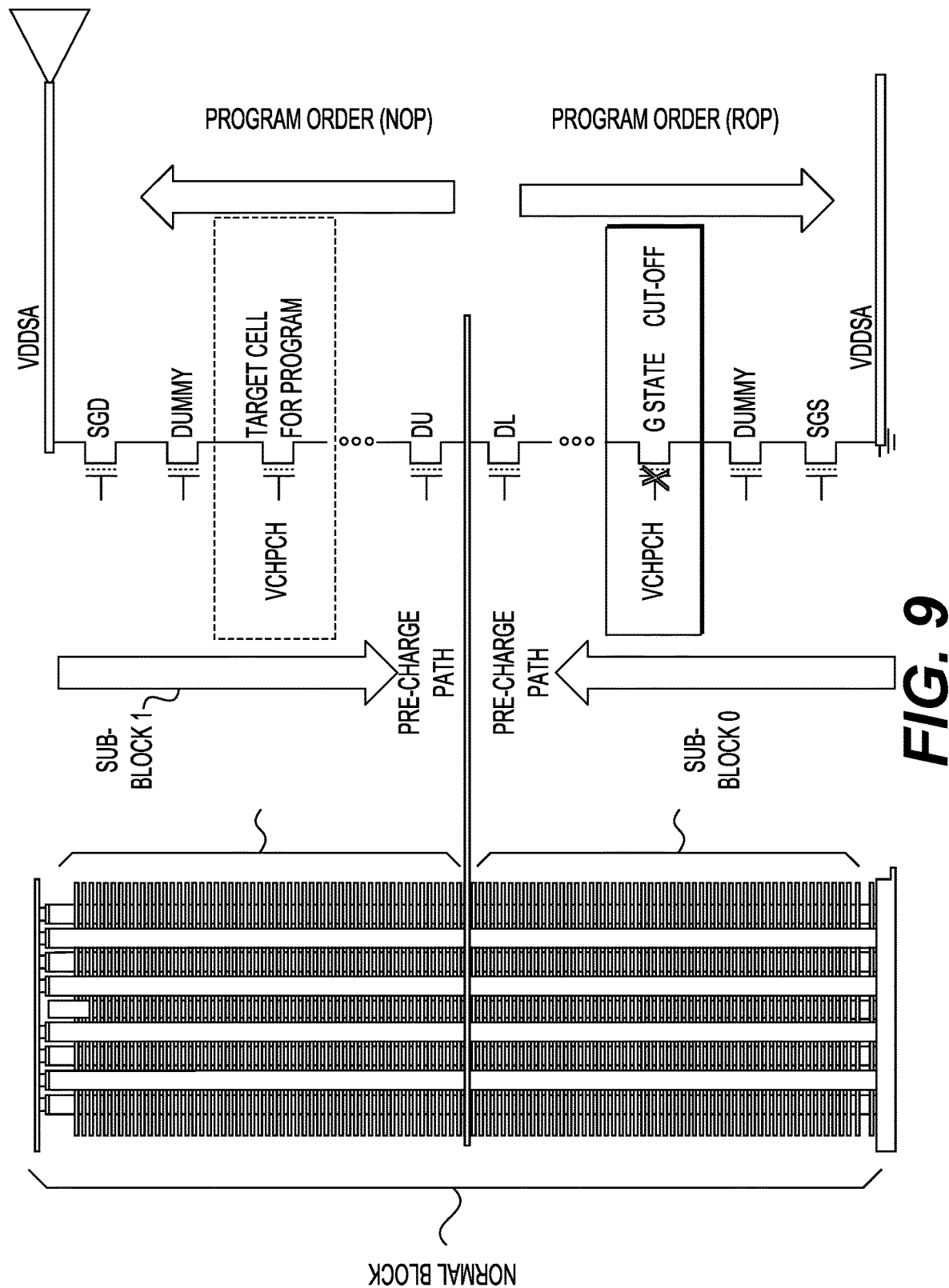
FIG. 9 shows an example stack of word lines and dielectric layers overlaying one another in an alternating fashion and divided into two sub-blocks and illustrates example pre-charge paths and programming order of strings of the memory cells according to aspects of the disclosure.
Figure 10:
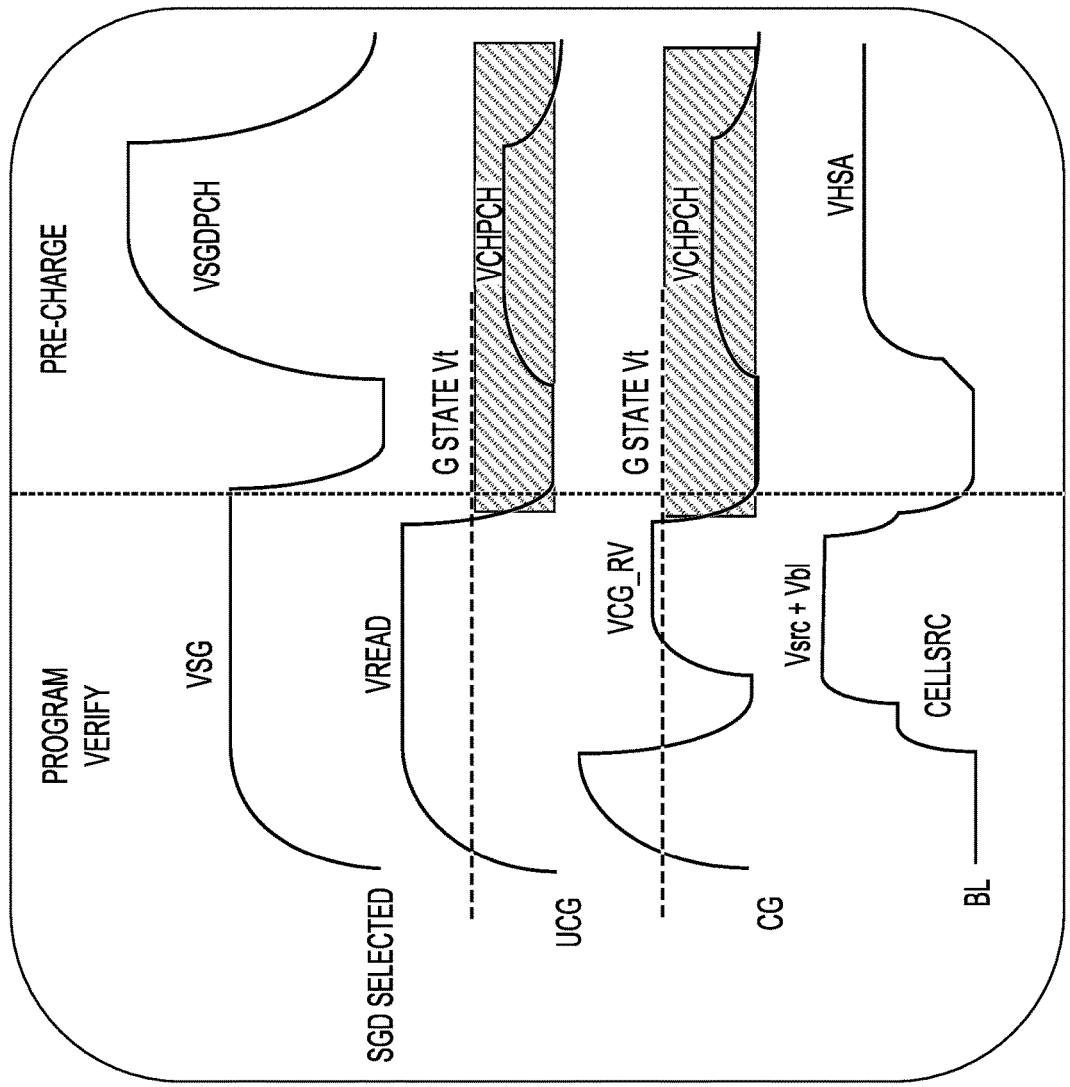
FIG. 10 shows voltage waveforms for a selected drain-side select gate, unselected word line or control gate, selected word line or control gate, and a bit line during a program-verify operation and immediately after during a pre-charge operation according to aspects of the disclosure.
Figure 11:
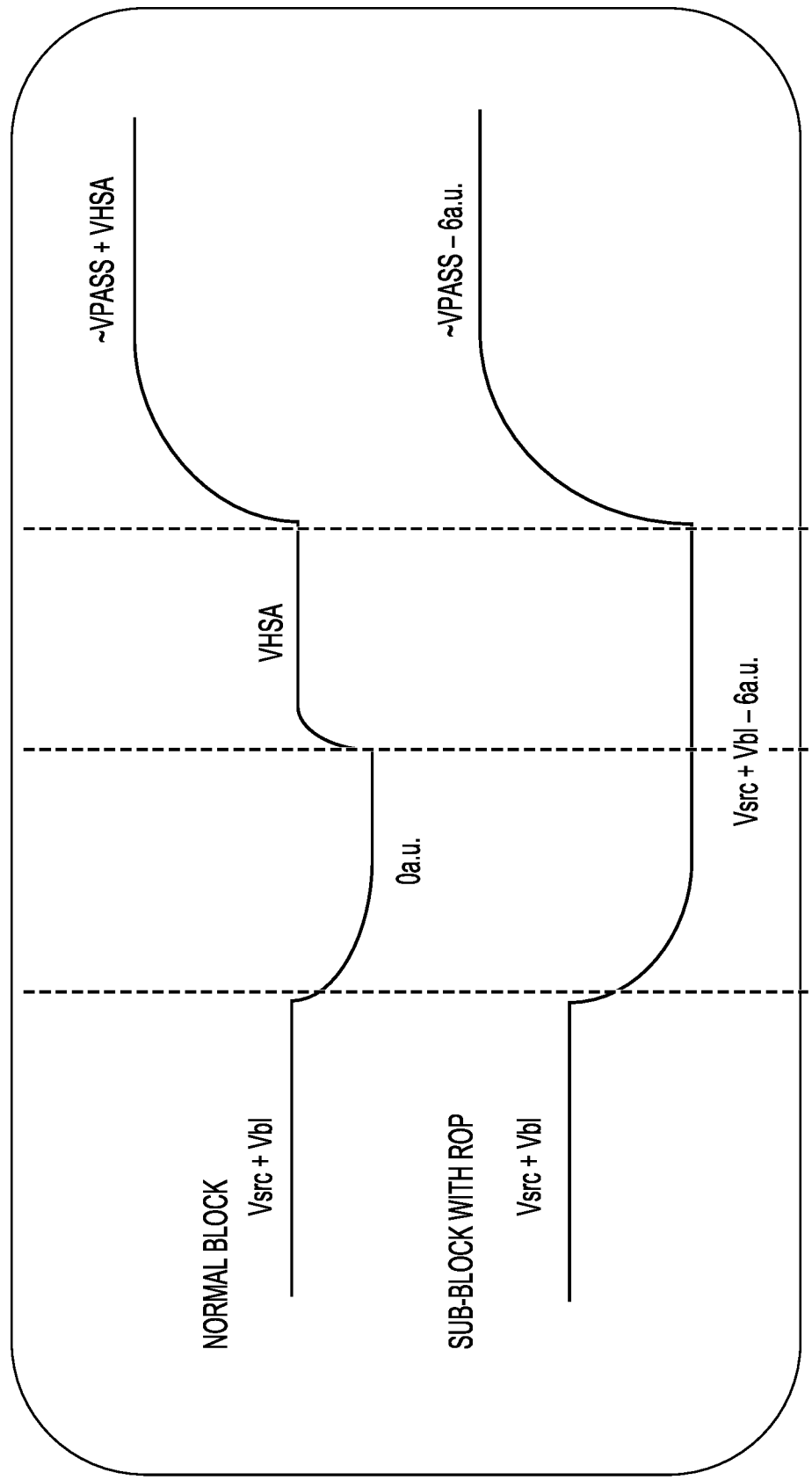
FIG. 11 shows plots of channel potential for a normal block and a sub-block with reverse order program according to aspects of the disclosure.
Figure 12:
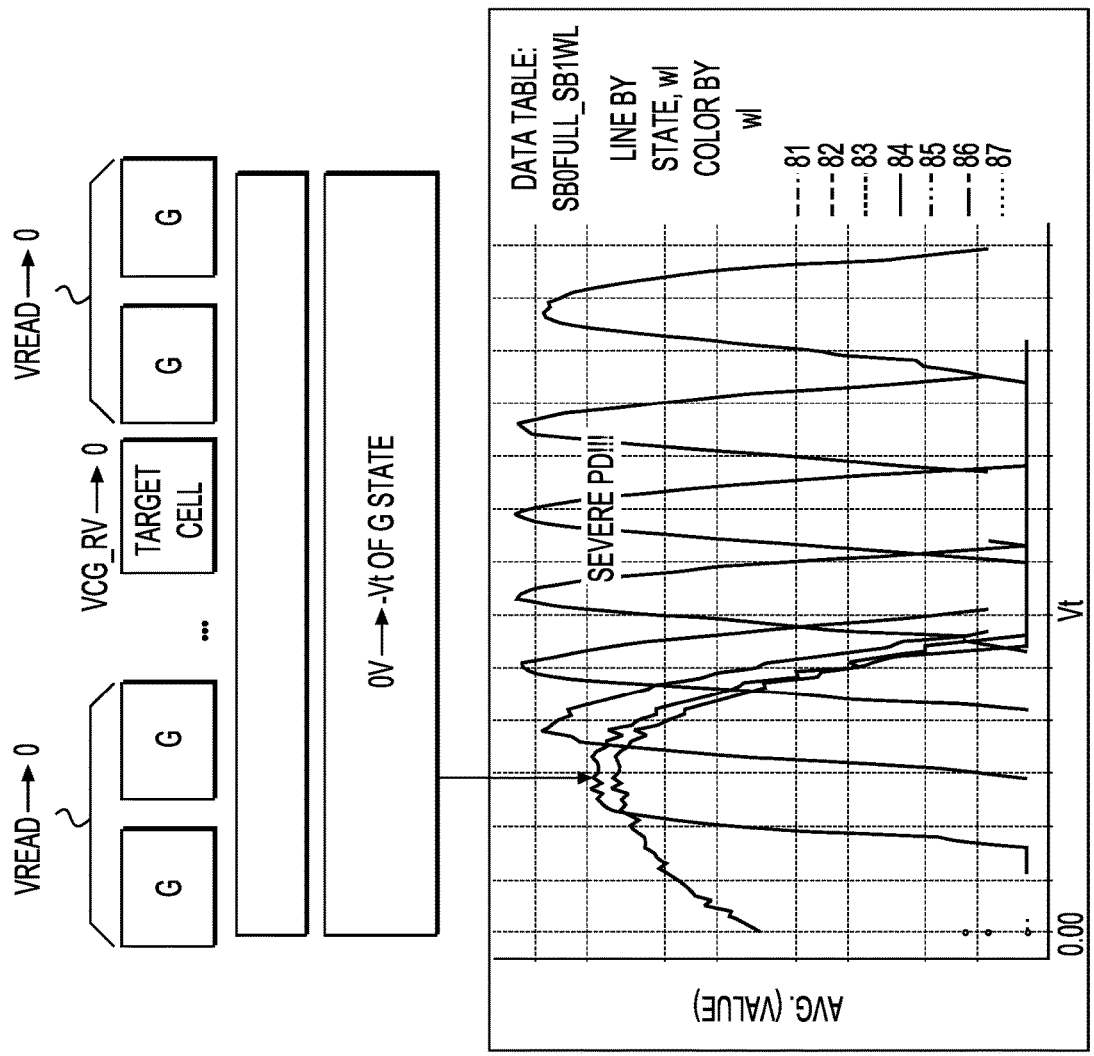
FIG. 12 shows a cross-sectional view of memory hole defining a channel with adjacent memory cells and a corresponding plot of the threshold voltage of memory cells following a program operation according to aspects of the disclosure.

FIG. 9 shows an example stack of word lines and dielectric layers overlaying one another in an alternating fashion and divided into two sub-blocks, sub-block 1 and sub-block 0 and illustrates example pre-charge paths and programming order of strings of the memory cells. As discussed, difficulties related to program-disturb and lower threshold voltage margins may arise when there are more than two tiers or if it is desired to program the memory cells in a different order. Specifically, in an example sub-block mode (SBM) operation, the program order is reverse order (ROP) for lower sub-block (e.g., sub-block 0), while is normal order (NOP) for the upper sub-block (e.g., sub-block 1). This strategy provides a pre-charge path from a source side for the lower sub-block and another pre-charge path from a drain side for the upper sub-block. FIG. 10 shows voltage waveforms for a selected drain-side select gate (SGD), unselected word line or control gate (UCG), selected word line or control gate (CG), and a bit line during a program-verify operation and immediately after during a pre-charge operation. As shown in FIG. 10 and referring back to FIG. 9, if reverse order program (ROP) is adopted by the upper sub-block, then the pre-charge path will be blocked when the lower sub-block is filled with data, thus leading to a severe program disturb (PD) issue. Specifically, as shown in FIG. 9, if one of the memory cells is programmed to a higher threshold voltage (e.g., associated with the G state for triple level cells or S7 of FIG. 5), then, as shown in FIG. 10, the pre-charge voltage VCHPCH is not sufficient to cause that memory cell to conduct during the pre-charge operation and the channel is therefore cut-off (i.e., the pre-charge path is blocked). FIG. 11 shows plots of channel potential for a normal block and a sub-block with reverse order program. As illustrated, the channel is cut-off early and is coupled to the word line potential. FIG. 12 shows a cross-sectional view of memory hole defining a channel with adjacent memory cells and a corresponding plot of the threshold voltage of memory cells following a program operation. As can be seen, due to the memory cells being programmed to a threshold voltage associated with the G state (S7 of FIG. 5), the channel is cutoff and becomes coupled to the word line potential (e.g., from 0 volts to the negative threshold voltage of the G state), which results in severe program disturb as shown in the plot in the lower portion of FIG. 12.

Figure 13:
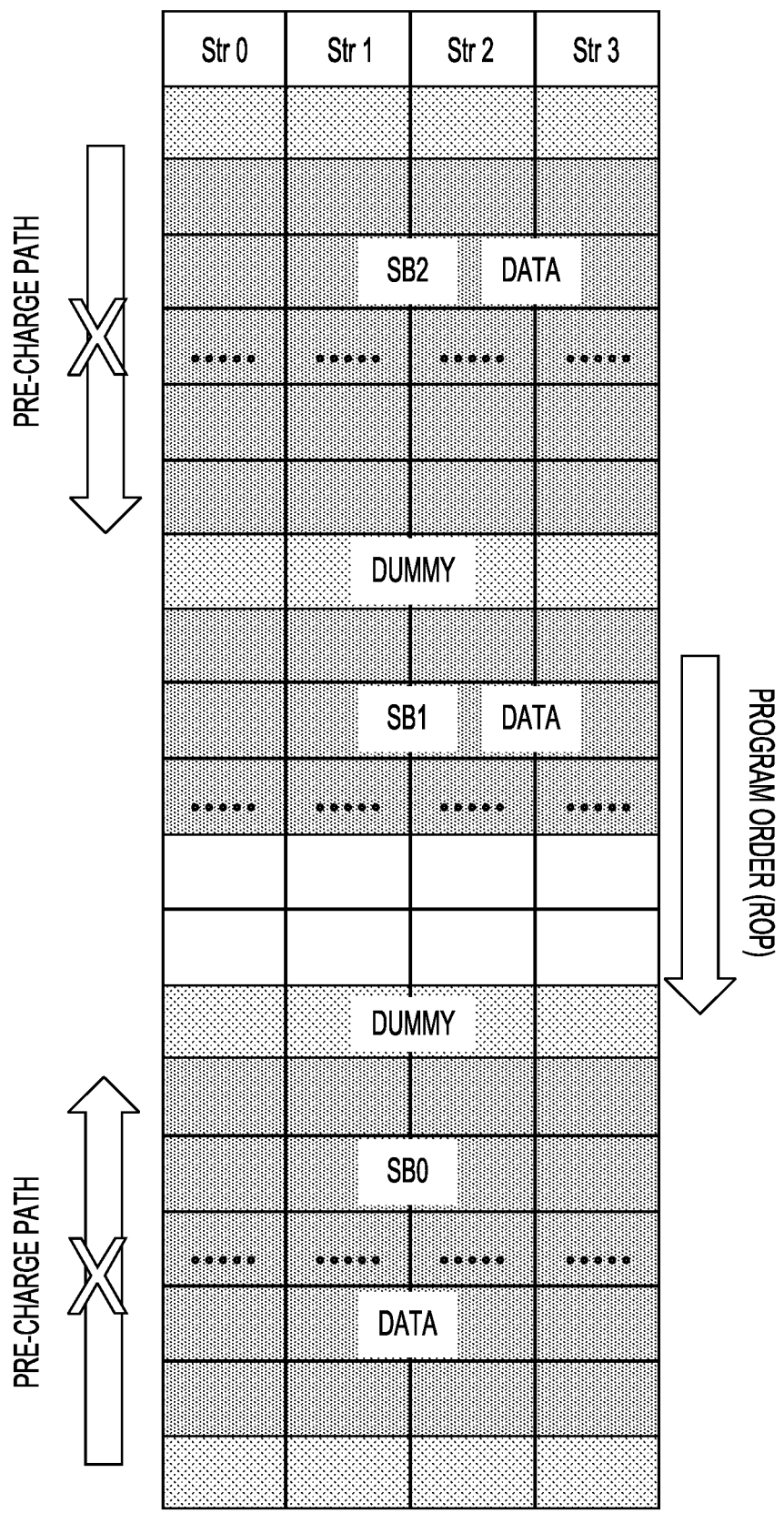
FIG. 13 shows an example memory apparatus with three tiers according to aspects of the disclosure.

The above-described strategy (as shown in FIG. 9) only works for two tier structures. In future memory apparatuses, many tier structures are inevitable, for example, three tiers. FIG. 13 shows an example memory apparatus with three tiers. If both the lower sub-block SB0 and upper sub-block SB2 are closed or full of data, and the middle sub-block SB1 is to be programmed, then under the pre-charge scheme described above, either program order (NOP or ROP) cannot provide a pre-charge path, as either drain or source side is blocked. In other words, either side pre-charge is impossible for the middle sub-block SB1 if both the lower sub-block SB0 and upper sub-block SB2 are closed or full of data. Also, for two tier structures or memory apparatuses, the NOP strategy for the middle sub-block SB1 is also imperfect, in the sense that NOP will always provide less threshold voltage margins than ROP, due to the larger neighbor word line interference in NOP.

Consequently, described herein is a memory apparatus (e.g., memory device 100 in FIG. 1) including memory cells (e.g., memory cells MC1-MC5 of FIG. 4E) each connected to one of a plurality of word lines (e.g., WL43-WLL47 of FIG. 4E). The memory cells are disposed in strings (e.g., NAND strings 482, 484, 486 of FIG. 4B) and configured to retain a threshold voltage corresponding to one of a plurality of data states (e.g., states S0-S7 of FIG. 5). The memory apparatus also includes a control means (e.g., control circuitry 110, controller 122, row decoder 124, source control circuits 127, read/write circuits 128, sense blocks 150, and column decoder 132 in FIG. 1) coupled to the plurality of word lines and the strings and configured to ramp a voltage applied to a selected one of the plurality of word lines from a verify voltage VCG_RV to a reduced voltage (e.g., 0 a.u. or 2 a.u.) during at least one program-verify portion of at least one program loop of a program operation. The control means is also configured to successively ramp voltages applied to each of a plurality of neighboring ones of the plurality of word lines from a read pass voltage VREAD to the reduced voltage (e.g., 0 a.u. or 2 a.u.) beginning with ones of the plurality of neighboring ones of the plurality of word lines immediately adjacent the selected one of the plurality of word lines and progressing to others of the plurality of neighboring ones of the plurality of word lines disposed increasingly remotely from the selected one of the plurality of word lines during the at least one program-verify portion of the at least one program loop of the program operation.

As discussed above, the plurality of word lines and a plurality of dielectric layers extend horizontally and overlay one another in an alternating fashion in a stack. The strings extend vertically through the stack and the memory cells are connected in series between a drain-side select gate transistor on a drain-side of each of the strings and connected to one of a plurality of bit lines and a source-side select gate transistor on a source-side of each of the strings and connected to a source line. According to an aspect, the plurality of neighboring ones of the plurality of word lines are arranged in a plurality of neighboring pairs of the plurality of word lines. Each successive one of the plurality of neighboring pairs of the plurality of word lines is progressively arranged more remotely from the selected one of the plurality of word lines and previous ones of the plurality of neighboring pairs. One of the plurality of word lines of each of the plurality of neighboring pairs is disposed on a drain-side of at least one of the selected one of the plurality of word lines. Another of the plurality of word lines of each of the plurality of neighboring pairs is disposed on a source-side of at least one of the selected one of the plurality of word lines.

Figure 14:
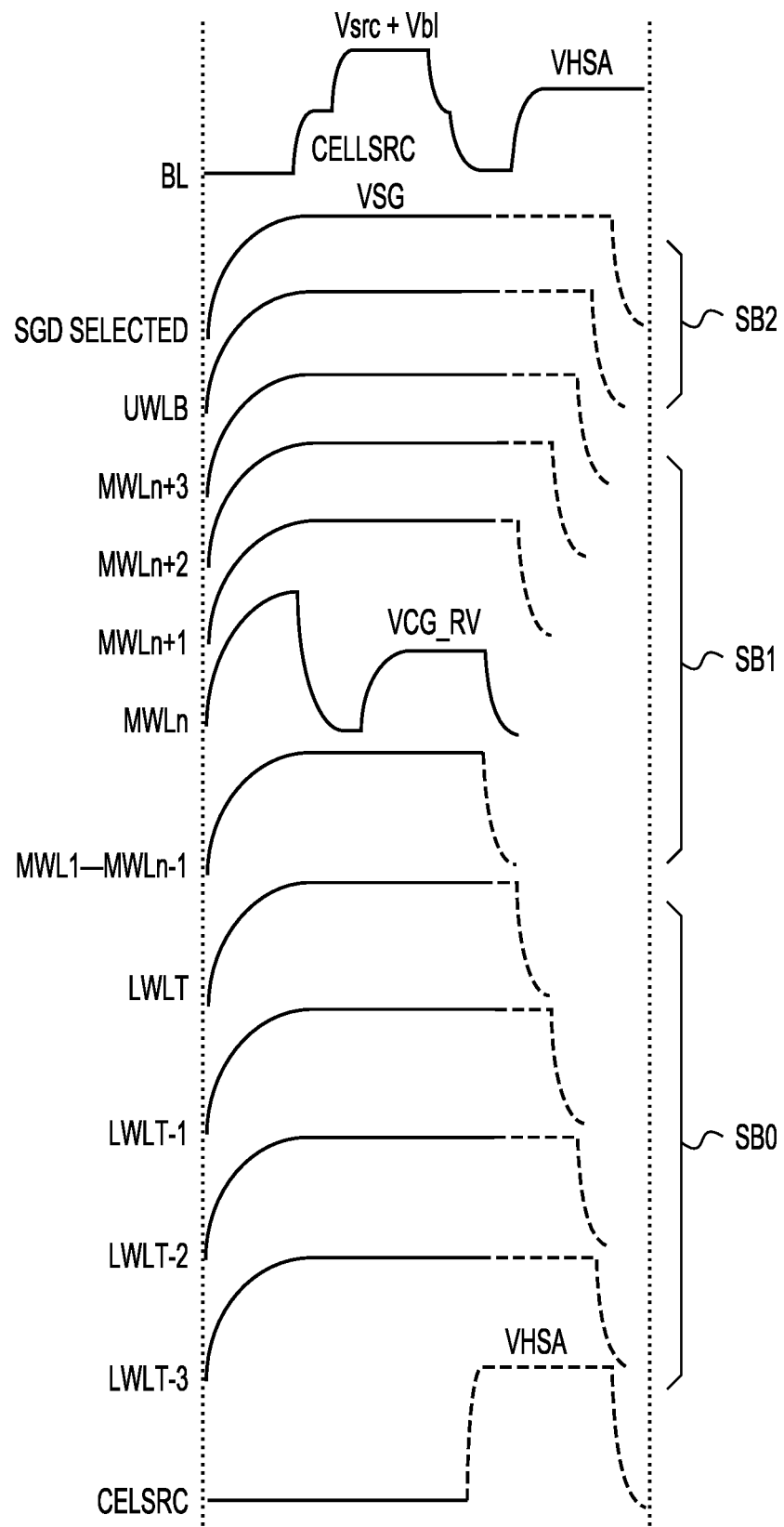
FIG. 14 shows an example set of voltage waveforms for a plurality of word lines illustrating operation of an exemplary memory apparatus implementing such a successive ramping of voltages for neighboring ones of the plurality of word lines according to aspects of the disclosure.
Figure 15:
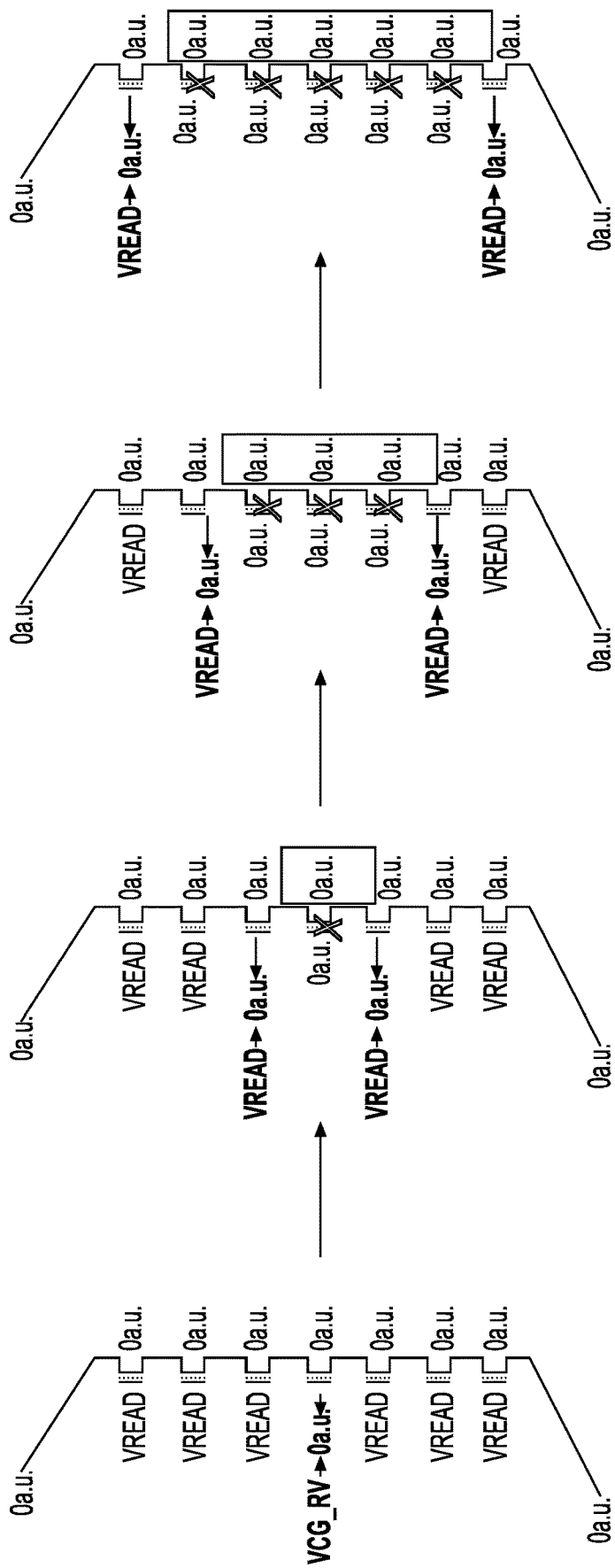
FIG. 15 shows the progression of the successive ramping in one example string according to aspects of the disclosure.

FIG. 14 shows an example set of voltage waveforms for a plurality of word lines illustrating operation of an exemplary memory apparatus implementing such a successive ramping of voltages for neighboring ones of the plurality of word lines. Specifically, during the program-verify operation the verify voltage VCG_RV is applied to the selected one of the plurality of word lines (e.g., MWLn of the middle sub-block Sb1) and ramped down to the reduced voltage (e.g., 0 a.u.), next voltages of the neighboring ones of the plurality of word lines immediately adjacent the selected one of the plurality of word lines (e.g., MWLn−MWLn−1 and MWLn+1 of the middle sub-block SB1) are ramped down from the read pass voltage VREAD to the reduced voltage (e.g., 0 a.u.). Next, the successive ramping progresses to ones of the plurality of neighboring others of the plurality of word lines disposed increasingly remotely from the selected one of the plurality of word lines (e.g., to MWLn+2 of the middle sub-block SB1 and LWLT of the lower sub-block SB0, and then to MWLn+3 of the middle sub-block SB1 and LWLT−1 of the lower sub-block SB0, etc. of the middle and lower sub-block). So, it should be noted that the successive ramping extends from one sub-block into another neighboring sub-block. One representative voltage waveform of one of the plurality of word lines of the upper sub-block SB2 is also shown. The corresponding bit line voltage, source line voltage CELSRC, and voltage applied to the selected drain-side select gate (SGD selected) are also shown and may also be ramped down as shown. FIG. 15 shows the progression of the successive ramping in one example string. While the reduced voltage to which the word lines are ramped is shown as 0 a.u., in reality, such a pre-charge voltage can be greater than 0 a.u, as drain-induced barrier lowering (DIBL) effect can help with the voltage going through. Due to the short channel effect, the channel voltage will be kept with 0 a.u. when the word line voltage is ramping down below the threshold voltage of certain cell. Also due to short channel effect, it is possible that each time, for each side, more than one word line can be ramping down at the same time. So, it should be appreciated that while as shown in FIG. 15, each time, on each side, only one word line is ramping down, it is contemplated that more than one word line on each side can be ramped down at the same time instead.

Again, the strings may be organized in rows grouped in a plurality of fingers (Fingers 0-3 of FIGS. 8A-8B) or strings (e.g., Str 0-3 of FIG. 13). The strings comprise each of a plurality of blocks. Referring back to FIG. 13, each of the plurality of blocks comprise a plurality of sub-blocks (e.g., SB0-SB2) arranged vertically in the stack and include a first sub-block (e.g., SB0) and a second sub-block (e.g., SB1) disposed vertically above the first sub-block and a third sub-block (e.g., SB2) disposed vertically above the first sub-block and the second sub-block. So, according to an aspect, the control means is further configured to program the memory cells connected to each of the plurality of word lines associated with each the plurality of sub-blocks in a reverse programming order (e.g., starting with the one of the plurality of word lines associated with each the plurality of sub-blocks disposed closest to a top of the stack and progressing with one of the plurality of word lines associated with each the plurality of sub-blocks disposed vertically below each previous one of the plurality of word lines).

The plurality of word lines comprises a total quantity of the plurality of word lines. According to an aspect, the control means is further configured to successively ramp voltages applied to each of the plurality of neighboring ones of the plurality of word lines from the read pass voltage to the reduced voltage beginning with ones of the plurality of neighboring ones of the plurality of word lines immediately adjacent the selected one of the plurality of word lines and progressing to others of the plurality of neighboring ones of the plurality of word lines disposed increasingly remotely from the selected one of the plurality of word lines. Such successive ramping continues until the voltages applied to each of the plurality of neighboring ones of the plurality of word lines have been ramped for a predetermined quantity of the plurality of word lines less than the total quantity of the plurality of word lines. So, the successive ramping may end after voltages have been ramped down for the predetermined quantity of the plurality of word lines less than the total quantity of the plurality of word lines.

Alternatively, according to another aspect, the control means is further configured to successively ramp voltages applied to each of the plurality of neighboring ones of the plurality of word lines from the read pass voltage to the reduced voltage beginning with ones of the plurality of neighboring ones of the plurality of word lines immediately adjacent the selected one of the plurality of word lines and progressing to others of the plurality of neighboring ones of the plurality of word lines disposed increasingly remotely from the selected one of the plurality of word lines during the at least one program-verify portion of the at least one program loop of the program operation. Such successive ramping continues until the voltages applied to each of the plurality of neighboring ones of the plurality of word lines have been ramped for a predetermined quantity of the plurality of word lines equal to the total quantity of the plurality of word lines.

As discussed, the at least one program loop of the program operation includes a plurality of program loops. So, according to an aspect, the control means is further configured to pre-charge each of the plurality of word lines prior to each of a series of program pulses of the program operation to enable the strings to conduct during a first one of the plurality of program loops. Thus, although no pre-charging may be employed in between successive program loops may be utilized, pre-charging as described above with respect to FIG. 9 may be utilized before the first program loop in some circumstances. Nevertheless, it should be noted that because pre-charging as shown in FIG. 9 is not possible in structures like that shown in FIG. 13, the type of pre-charging shown in FIG. 9 for the first program loop would only be used for structures with two tiers or less. Even if such pre-charging is completed for the first program loop, no pre-charging like in FIG. 9 is needed in the remaining program loops. So, the control means is further configured to successively ramp voltages applied to each of the plurality of neighboring ones of the plurality of word lines from the read pass voltage to the reduced voltage beginning with ones of the plurality of neighboring ones of the plurality of word lines immediately adjacent the selected one of the plurality of word lines and progressing to others of the plurality of neighboring ones of the plurality of word lines disposed increasingly remotely from the selected one of the plurality of word lines during the at least one program-verify portion of the at least one program loop of the program operation in each of the plurality of program loops following the first one of the plurality of program loops.

Figure 16:
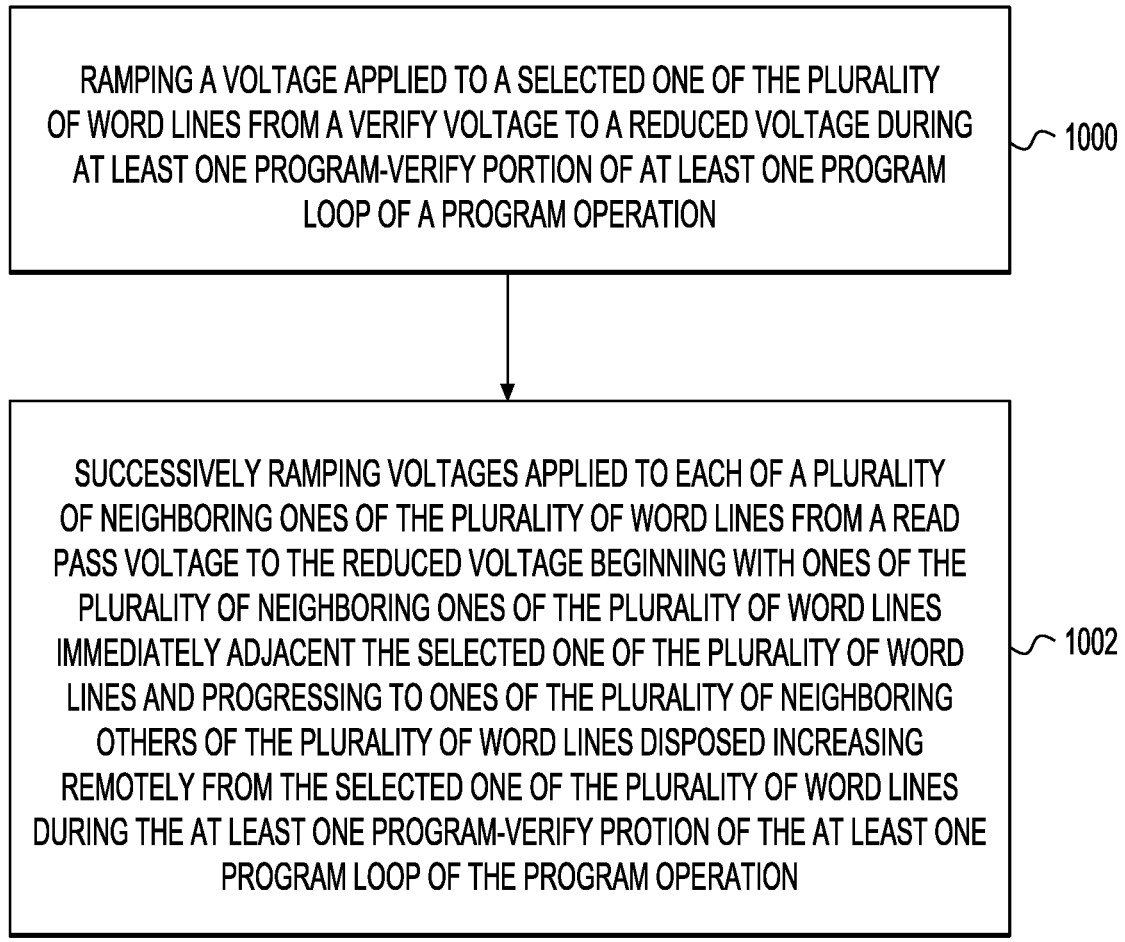
FIG. 16 illustrates steps of a method of operating a memory apparatus according to aspects of the disclosure.

Now referring to FIG. 16, a method of operating a memory apparatus is also provided. As discussed above, the memory apparatus (e.g., memory device 100 in FIG. 1) includes memory cells (e.g., memory cells MC1-MC5 of FIG. 4E) each connected to one of a plurality of word lines (e.g., WL43-WLL47 of FIG. 4E). The memory cells are disposed in strings (e.g., NAND strings 482, 484, 486 of FIG. 4B) and configured to retain a threshold voltage corresponding to one of a plurality of data states (e.g., states S0-S7 of FIG. 5). So, the method includes the step of 1000 ramping a voltage applied to a selected one of the plurality of word lines from a verify voltage to a reduced voltage during at least one program-verify portion of at least one program loop of a program operation. The method continues with the step of 1002 successively ramping voltages applied to each of a plurality of neighboring ones of the plurality of word lines from a read pass voltage to the reduced voltage beginning with ones of the plurality of neighboring ones of the plurality of word lines immediately adjacent the selected one of the plurality of word lines and progressing to others of the plurality of neighboring ones of the plurality of word lines disposed increasingly remotely from the selected one of the plurality of word lines during the at least one program-verify portion of the at least one program loop of the program operation.

Again, the plurality of the plurality of word lines and the plurality of dielectric layers extend horizontally and overlay one another in an alternating fashion in the stack. The strings extend vertically through the stack and the memory cells are connected in series between a drain-side select gate transistor on a drain-side of each of the strings and connected to one of a plurality of bit lines and a source-side select gate transistor on a source-side of each of the strings and connected to a source line. So, according to an aspect, the plurality of neighboring ones of the plurality of word lines are arranged in a plurality of neighboring pairs of the plurality of word lines. Each successive one of the plurality of neighboring pairs of the plurality of word lines is progressively arranged more remotely from the selected one of the plurality of word lines and previous ones of the plurality of neighboring pairs. One of the plurality of word lines of each of the plurality of neighboring pairs is disposed on a drain-side of at least one of the selected one of the plurality of word lines. Another of the plurality of word lines of each of the plurality of neighboring pairs is disposed on a source-side of at least one of the selected one of the plurality of word lines.

As discussed, wherein the strings are organized in rows grouped in a plurality of fingers (Fingers 0-3 of FIGS. 8A-8B) or strings (e.g., Str 0-3 of FIG. 13). The strings comprise each of a plurality of blocks. Referring back to FIG. 13, each of the plurality of blocks comprise a plurality of sub-blocks (e.g., SB0-SB2) arranged vertically in the stack and include a first sub-block (e.g., SB0) and a second sub-block (e.g., SB1) disposed vertically above the first sub-block and a third sub-block (e.g., SB2) disposed vertically above the first sub-block and the second sub-block. So, the method further includes the step of programming the memory cells connected to each of the plurality of word lines associated with each the plurality of sub-blocks in a reverse programming order (e.g., starting with the one of the plurality of word lines associated with each the plurality of sub-blocks disposed closest to a top of the stack and progressing with one of the plurality of word lines associated with each the plurality of sub-blocks disposed vertically below each previous one of the plurality of word lines.

Again, the plurality of word lines comprises the total quantity of the plurality of word lines. So, according to an aspect, the method further includes the step of successively ramping voltages applied to each of the plurality of neighboring ones of the plurality of word lines from the read pass voltage to the reduced voltage beginning with ones of the plurality of neighboring ones of the plurality of word lines immediately adjacent the selected one of the plurality of word lines and progressing to others of the plurality of neighboring ones of the plurality of word lines disposed increasingly remotely from the selected one of the plurality of word lines. Such successive ramping continues until the voltages applied to each of the plurality of neighboring ones of the plurality of word lines have been ramped for a predetermined quantity of the plurality of word lines less than the total quantity of the plurality of word lines.

On the other hand, the method can instead further include the step of successively ramping voltages applied to each of the plurality of neighboring ones of the plurality of word lines from the read pass voltage to the reduced voltage beginning with ones of the plurality of neighboring ones of the plurality of word lines immediately adjacent the selected one of the plurality of word lines and progressing to others of the plurality of neighboring ones of the plurality of word lines disposed increasingly remotely from the selected one of the plurality of word lines during the at least one program-verify portion of the at least one program loop of the program operation. Such successive ramping continues until the voltages applied to each of the plurality of neighboring ones of the plurality of word lines have been ramped for a predetermined quantity of the plurality of word lines equal to the total quantity of the plurality of word lines.

As discussed, the at least one program loop of the program operation includes a plurality of program loops. So, according to an aspect, the method further includes the step of pre-charging each of the plurality of word lines prior to each of a series of program pulses of the program operation to enable the strings to conduct during a first one of the plurality of program loops. According to additional aspects, the method can further include the step of successively ramping voltages applied to each of the plurality of neighboring ones of the plurality of word lines from the read pass voltage to the reduced voltage beginning with ones of the plurality of neighboring ones of the plurality of word lines immediately adjacent the selected one of the plurality of word lines and progressing to others of the plurality of neighboring ones of the plurality of word lines disposed increasingly remotely from the selected one of the plurality of word lines during the at least one program-verify portion of the at least one program loop of the program operation in each of the plurality of program loops following the first one of the plurality of program loops.

Clearly, changes may be made to what is described and illustrated herein without, however, departing from the scope defined in the accompanying claims. The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

The terminology used herein is for the purpose of describing particular example embodiments only and is not intended to be limiting. As used herein, the singular forms "a," "an," and "the" may be intended to include the plural forms as well, unless the context clearly indicates otherwise. The terms "comprises," "comprising," "including," and "having," are inclusive and therefore specify the presence of stated features, integers, steps, operations, elements, and/or components, but do not preclude the presence or addition of one or more other features, integers, steps, operations, elements, components, and/or groups thereof. The method steps, processes, and operations described herein are not to be construed as necessarily requiring their performance in the particular order discussed or illustrated, unless specifically identified as an order of performance. It is also to be understood that additional or alternative steps may be employed.

When an element or layer is referred to as being "on," "engaged to," "connected to," or "coupled to" another element or layer, it may be directly on, engaged, connected or coupled to the other element or layer, or intervening elements or layers may be present. In contrast, when an element is referred to as being "directly on," "directly engaged to," "directly connected to," or "directly coupled to" another element or layer, there may be no intervening elements or layers present. Other words used to describe the relationship between elements should be interpreted in a like fashion (e.g., "between" versus "directly between," "adjacent" versus "directly adjacent," etc.). As used herein, the term "and/or" includes any and all combinations of one or more of the associated listed items.

Although the terms first, second, third, etc. may be used herein to describe various elements, components, regions, layers and/or sections, these elements, components, regions, layers and/or sections should not be limited by these terms. These terms may be only used to distinguish one element, component, region, layer or section from another region, layer or section. Terms such as "first," "second," and other numerical terms when used herein do not imply a sequence or order unless clearly indicated by the context. Thus, a first element, component, region, layer or section discussed below could be termed a second element, component, region, layer or section without departing from the teachings of the example embodiments.

Spatially relative terms, such as "inner," "outer," "beneath," "below," "lower," "above," "upper," "top", "bottom", and the like, may be used herein for ease of description to describe one element's or feature's relationship to another element(s) or feature(s) as illustrated in the figures. Spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptions used herein interpreted accordingly.

What is claimed is:

1. A memory apparatus, comprising:
   memory cells each connected to one of a plurality of word lines and disposed in strings and configured to retain a threshold voltage corresponding to one of a plurality of data states; and
   a control means coupled to the plurality of word lines and the strings and configured to:
      ramp a voltage applied to a selected one of the plurality of word lines from a verify voltage to a reduced voltage during at least one program-verify portion of at least one program loop of a program operation, and
      successively ramp voltages applied to each of a plurality of neighboring ones of the plurality of word lines from a read pass voltage to the reduced voltage beginning with ones of the plurality of neighboring ones of the plurality of word lines immediately adjacent the selected one of the plurality of word lines and progressing to others of the plurality of neighboring ones of the plurality of word lines disposed increasingly remotely from the selected one of the plurality of word lines during the at least one program-verify portion of the at least one program loop of the program operation.

2. The memory apparatus as set forth in claim 1, wherein the plurality of the plurality of word lines and a plurality of dielectric layers extend horizontally and overlay one another in an alternating fashion in a stack, the strings extend vertically through the stack, the memory cells are connected in series between a drain-side select gate transistor on a drain-side of each of the strings and connected to one of a plurality of bit lines and a source-side select gate transistor on a source-side of each of the strings and connected to a source line, the plurality of neighboring ones of the plurality of word lines are arranged in a plurality of neighboring pairs of the plurality of word lines, each successive one of the plurality of neighboring pairs of the plurality of word lines is progressively arranged more remotely from the selected one of the plurality of word lines and previous ones of the plurality of neighboring pairs, one of the plurality of word lines of each of the plurality of neighboring pairs is disposed on a drain-side of at least one of the selected one of the plurality of word lines and another of the plurality of word lines of each of the plurality of neighboring pairs is disposed on a source-side of at least one of the selected one of the plurality of word lines.

3. The memory apparatus as set forth in claim 2, wherein the strings are organized in rows grouped in a plurality of fingers, the strings comprise each of a plurality of blocks, each of the plurality of blocks comprise a plurality of sub-blocks arranged vertically in the stack and including a first sub-block and a second sub-block disposed vertically above the first sub-block and a third sub-block disposed vertically above the first sub-block and the second sub-block, and the control means is further configured to program the memory cells connected to each of the plurality of word lines associated with each the plurality of sub-blocks in a reverse programming order.

4. The memory apparatus as set forth in claim 1, wherein the plurality of word lines comprises a total quantity of the plurality of word lines and the control means is further configured to successively ramp voltages applied to each of the plurality of neighboring ones of the plurality of word lines from the read pass voltage to the reduced voltage beginning with ones of the plurality of neighboring ones of the plurality of word lines immediately adjacent the selected one of the plurality of word lines and progressing to others of the plurality of neighboring ones of the plurality of word lines disposed increasingly remotely from the selected one of the plurality of word lines until the voltages applied to each of the plurality of neighboring ones of the plurality of word lines have been ramped for a predetermined quantity of the plurality of word lines less than the total quantity of the plurality of word lines.

5. The memory apparatus as set forth in claim 1, wherein the plurality of word lines comprises a total quantity of the plurality of word lines and the control means is further configured to successively ramp voltages applied to each of the plurality of neighboring ones of the plurality of word lines from the read pass voltage to the reduced voltage beginning with ones of the plurality of neighboring ones of the plurality of word lines immediately adjacent the selected one of the plurality of word lines and progressing to others of the plurality of neighboring ones of the plurality of word lines disposed increasingly remotely from the selected one of the plurality of word lines during the at least one program-verify portion of the at least one program loop of the program operation until the voltages applied to each of the plurality of neighboring ones of the plurality of word lines have been ramped for a predetermined quantity of the plurality of word lines equal to the total quantity of the plurality of word lines.

6. The memory apparatus as set forth in claim 1, wherein the at least one program loop of the program operation includes a plurality of program loops and the control means is further configured to pre-charge each of the plurality of word lines prior to each of a series of program pulses of the program operation to enable the strings to conduct during a first one of the plurality of program loops.

7. The memory apparatus as set forth in claim 6, wherein the control means is further configured to successively ramp voltages applied to each of the plurality of neighboring ones of the plurality of word lines from the read pass voltage to the reduced voltage beginning with ones of the plurality of neighboring ones of the plurality of word lines immediately adjacent the selected one of the plurality of word lines and progressing to others of the plurality of neighboring ones of the plurality of word lines disposed increasingly remotely from the selected one of the plurality of word lines during the at least one program-verify portion of the at least one program loop of the program operation in each of the plurality of program loops following the first one of the plurality of program loops.

8. A controller in communication with a memory apparatus including memory cells each connected to one of a plurality of word lines and disposed in strings and configured to retain a threshold voltage corresponding to one of a plurality of data states, the controller configured to:
instruct the memory apparatus to ramp a voltage applied to a selected one of the plurality of word lines from a verify voltage to a reduced voltage during at least one program-verify portion of at least one program loop of a program operation, and
instruct the memory apparatus to successively ramp voltages applied to each of a plurality of neighboring ones of the plurality of word lines from a read pass voltage to the reduced voltage beginning with ones of the plurality of neighboring ones of the plurality of word lines immediately adjacent the selected one of the plurality of word lines and progressing to others of the plurality of neighboring ones of the plurality of word lines disposed increasingly remotely from the selected one of the plurality of word lines during the at least one program-verify portion of the at least one program loop of the program operation.

9. The controller as set forth in claim 8, wherein the plurality of the plurality of word lines and a plurality of dielectric layers extend horizontally and overlay one another in an alternating fashion in a stack, the strings extend vertically through the stack, the memory cells are connected in series between a drain-side select gate transistor on a drain-side of each of the strings and connected to one of a plurality of bit lines and a source-side select gate transistor on a source-side of each of the strings and connected to a source line, the plurality of neighboring ones of the plurality of word lines are arranged in a plurality of neighboring pairs of the plurality of word lines, each successive one of the plurality of neighboring pairs of the plurality of word lines is progressively arranged more remotely from the selected one of the plurality of word lines and previous ones of the plurality of neighboring pairs, one of the plurality of word lines of each of the plurality of neighboring pairs is disposed on a drain-side of at least one of the selected one of the plurality of word lines and another of the plurality of word lines of each of the plurality of neighboring pairs is disposed on a source-side of at least one of the selected one of the plurality of word lines.

10. The controller as set forth in claim 9, wherein the strings are organized in rows grouped in a plurality of fingers, the strings comprise each of a plurality of blocks, each of the plurality of blocks comprise a plurality of sub-blocks arranged vertically in the stack and including a first sub-block and a second sub-block disposed vertically above the first sub-block and a third sub-block disposed vertically above the first sub-block and the second sub-block, and the controller is further configured to instruct the memory apparatus to program the memory cells connected to each of the plurality of word lines associated with each the plurality of sub-blocks in a reverse programming order.

11. The controller as set forth in claim 8, wherein the plurality of word lines comprises a total quantity of the plurality of word lines and the controller is further configured to instruct the memory apparatus to successively ramp voltages applied to each of the plurality of neighboring ones of the plurality of word lines from the read pass voltage to the reduced voltage beginning with ones of the plurality of neighboring ones of the plurality of word lines immediately adjacent the selected one of the plurality of word lines and progressing to others of the plurality of neighboring ones of the plurality of word lines disposed increasingly remotely from the selected one of the plurality of word lines until the voltages applied to each of the plurality of neighboring ones of the plurality of word lines have been ramped for a predetermined quantity of the plurality of word lines less than the total quantity of the plurality of word lines.

12. The controller as set forth in claim 8, wherein the plurality of word lines comprises a total quantity of the plurality of word lines and the controller is further configured to instruct the memory apparatus to successively ramp voltages applied to each of the plurality of neighboring ones of the plurality of word lines from the read pass voltage to the reduced voltage beginning with ones of the plurality of neighboring ones of the plurality of word lines immediately adjacent the selected one of the plurality of word lines and progressing to others of the plurality of neighboring ones of the plurality of word lines disposed increasingly remotely from the selected one of the plurality of word lines during the at least one program-verify portion of the at least one program loop of the program operation until the voltages applied to each of the plurality of neighboring ones of the plurality of word lines have been ramped for a predetermined quantity of the plurality of word lines equal to the total quantity of the plurality of word lines.

13. The controller as set forth in claim 8, wherein the at least one program loop of the program operation includes a plurality of program loops and the controller is further configured to instruct the memory apparatus to pre-charge each of the plurality of word lines prior to each of a series of program pulses of the program operation to enable the strings to conduct during a first one of the plurality of program loops.

14. A method of operating a memory apparatus including memory cells each connected to one of a plurality of word lines and disposed in strings and configured to retain a threshold voltage corresponding to one of a plurality of data states, the method comprising the steps of:
  ramping a voltage applied to a selected one of the plurality of word lines from a verify voltage to a reduced voltage during at least one program-verify portion of at least one program loop of a program operation; and
  successively ramping voltages applied to each of a plurality of neighboring ones of the plurality of word lines from a read pass voltage to the reduced voltage beginning with ones of the plurality of neighboring ones of the plurality of word lines immediately adjacent the selected one of the plurality of word lines and progressing to others of the plurality of neighboring ones of the plurality of word lines disposed increasingly remotely from the selected one of the plurality of word lines during the at least one program-verify portion of the at least one program loop of the program operation.

15. The method as set forth in claim 14, wherein the plurality of the plurality of word lines and a plurality of dielectric layers extend horizontally and overlay one another in an alternating fashion in a stack, the strings extend vertically through the stack, the memory cells are connected in series between a drain-side select gate transistor on a drain-side of each of the strings and connected to one of a plurality of bit lines and a source-side select gate transistor on a source-side of each of the strings and connected to a source line, the plurality of neighboring ones of the plurality of word lines are arranged in a plurality of neighboring pairs of the plurality of word lines, each successive one of the plurality of neighboring pairs of the plurality of word lines is progressively arranged more remotely from the selected one of the plurality of word lines and previous ones of the plurality of neighboring pairs, one of the plurality of word lines of each of the plurality of neighboring pairs is disposed on a drain-side of at least one of the selected one of the plurality of word lines and another of the plurality of word lines of each of the plurality of neighboring pairs is disposed on a source-side of at least one of the selected one of the plurality of word lines.

16. The method as set forth in claim 15, wherein the strings are organized in rows grouped in a plurality of fingers, the strings comprise each of a plurality of blocks, each of the plurality of blocks comprise a plurality of sub-blocks arranged vertically in the stack and including a first sub-block and a second sub-block disposed vertically above the first sub-block and a third sub-block disposed vertically above the first sub-block and the second sub-block, and the method further includes the step of programming the memory cells connected to each of the plurality of word lines associated with each the plurality of sub-blocks in a reverse programming order.

17. The method as set forth in claim 14, wherein the plurality of word lines comprises a total quantity of the plurality of word lines and the method further includes the step of successively ramping voltages applied to each of the plurality of neighboring ones of the plurality of word lines from the read pass voltage to the reduced voltage beginning with ones of the plurality of neighboring ones of the plurality of word lines immediately adjacent the selected one of the plurality of word lines and progressing to others of the plurality of neighboring ones of the plurality of word lines disposed increasingly remotely from the selected one of the plurality of word lines until the voltages applied to each of the plurality of neighboring ones of the plurality of word lines have been ramped for a predetermined quantity of the plurality of word lines less than the total quantity of the plurality of word lines.

18. The method as set forth in claim 14, wherein the plurality of word lines comprises a total quantity of the plurality of word lines and the method further includes the step of successively ramping voltages applied to each of the plurality of neighboring ones of the plurality of word lines from the read pass voltage to the reduced voltage beginning with ones of the plurality of neighboring ones of the plurality of word lines immediately adjacent the selected one of the plurality of word lines and progressing to others of the plurality of neighboring ones of the plurality of word lines disposed increasingly remotely from the selected one of the plurality of word lines during the at least one program-verify portion of the at least one program loop of the program operation until the voltages applied to each of the plurality of neighboring ones of the plurality of word lines have been ramped for a predetermined quantity of the plurality of word lines equal to the total quantity of the plurality of word lines.

19. The method as set forth in claim 14, wherein the at least one program loop of the program operation includes a plurality of program loops and the method further includes the step of pre-charging each of the plurality of word lines prior to each of a series of program pulses of the program operation to enable the strings to conduct during a first one of the plurality of program loops.

20. The method as set forth in claim 19, further including the step of successively ramping voltages applied to each of the plurality of neighboring ones of the plurality of word lines from the read pass voltage to the reduced voltage beginning with ones of the plurality of neighboring ones of the plurality of word lines immediately adjacent the selected one of the plurality of word lines and progressing to others of the plurality of neighboring ones of the plurality of word lines disposed increasingly remotely from the selected one of the plurality of word lines during the at least one program-verify portion of the at least one program loop of the program operation in each of the plurality of program loops following the first one of the plurality of program loops.

\* \* \* \* \*